US012672564B2

(12) United States Patent
Ecton et al.

(10) Patent No.: US 12,672,564 B2
(45) Date of Patent: Jun. 30, 2026

(54) TECHNOLOGIES FOR VERTICALLY INTERCONNECTED GLASS CORE ARCHITECTURE

(71) Applicant: Intel Corporation, Santa Clara, CA (US)

(72) Inventors: Jeremy D. Ecton, Gilbert, AZ (US); Brandon Christian Marin, Gilbert, AZ (US); Srinivas V. Pietambaram, Chandler, AZ (US); Gang Duan, Chandler, AZ (US); Suddhasattwa Nad, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/091,560

(22) Filed: Dec. 30, 2022

(65) Prior Publication Data

US 2024/0222279 A1 Jul. 4, 2024

(51) Int. Cl.
| | |
|---|---|
| *H10W 70/65* | (2026.01) |
| *H10W 20/20* | (2026.01) |
| *H10W 40/70* | (2026.01) |
| *H10W 70/60* | (2026.01) |
| *H10W 70/63* | (2026.01) |

(Continued)

(52) U.S. Cl.
CPC ........... *H10W 70/65* (2026.01); *H10W 20/20* (2026.01); *H10W 40/70* (2026.01); *H10W 70/611* (2026.01); *H10W 70/635* (2026.01); *H10W 70/692* (2026.01); *H10W 90/00* (2026.01); *H10W 99/00* (2026.01); *H10W 90/792* (2026.01)

(58) Field of Classification Search
CPC ............. H10W 70/616; H10W 70/617; H10W 70/618; H10W 70/692; H10W 70/611; H10W 90/297; H10W 90/22; H10W 20/20; H10W 70/635; H01L 23/15; H01L 23/384
See application file for complete search history.

(56) References Cited

U.S. PATENT DOCUMENTS

| | | | |
|---|---|---|---|
| 2017/0358447 A1 | 12/2017 | Tsunetomo et al. | |
| 2022/0375865 A1* | 11/2022 | Pietambaram | ........... H10D 1/20 |

FOREIGN PATENT DOCUMENTS

| | | | | |
|---|---|---|---|---|
| DE | 202014103794 U1 * | 10/2014 | ......... | H10W 70/618 |

OTHER PUBLICATIONS

Gao, Guilian et al., "Low Temperature Cu Interconnect with Chip to Wafer Hybrid Bonding," 2019 IEEE 69th Electronic Components Technology Conference (ECTCC) (2019) (8 pages).

(Continued)

*Primary Examiner* — Davienne N Monbleau
*Assistant Examiner* — Emily Farmer
(74) *Attorney, Agent, or Firm* — Alliance IP, LLC

(57) ABSTRACT

Technologies for a vertically interconnected glass layer architecture is disclosed. In the illustrative embodiment, an integrated circuit component includes several integrated circuit dies and a glass layer. Integrated circuit dies are positioned both above and below the glass layer. The glass layer has a bridge die embedded in a cavity. The bridge die provides interconnects between the various dies and to other components off of the integrated circuit component. The glass layer can enable three-dimensional heterogeneous integration, allowing for fine pitch connections between dies.

20 Claims, 21 Drawing Sheets

(51) Int. Cl.
    *H10W 70/692*     (2026.01)
    *H10W 90/00*      (2026.01)
    *H10W 99/00*      (2026.01)

(56)               References Cited

OTHER PUBLICATIONS

Lau, John H., "Recent Advances and Trends in Advanced Packaging," IEEE Transactions on Components, Packaging and Manufacturing Technology, vol. 12, No. 2, Feb. 2022 (25 pages).
Sukumaran, Vijay et al., "Design, Fabrication and Characterization of Ultrathin 3-D Glass Interposers with Through-Package-Vias at Same Pitch as TSVs in Silicon," IEEE Transactions on Components, Packaging, and Manufacturing Technology, vol. 4, No. 5, May 2014 (10 pages).

* cited by examiner

100

102

104

2

2

600

| 602 | PLACE GLASS SUBSTRATE ON CARRIER |
| 604 | PATTERN CAVITY FOR BRIDGE DIE |
| 606 | INSERT BRIDGE DIE |
| 608 | DEPOSIT MOLD AND PLANARIZE |
| 610 | PATTERN THROUGH GLASS VIAS |
| 612 | FILL THROUGH GLASS VIAS |
| 614 | REMOVE FROM CARRIER |
| 616 | ATTACH TOP DIES |
| 618 | PATTERN PILLARS AND ATTACH BOTTOM DIES |
| 620 | DEPOSIT MOLD AND PLANARIZE |
| 622 | COMPLETE BUMPING |

202

702

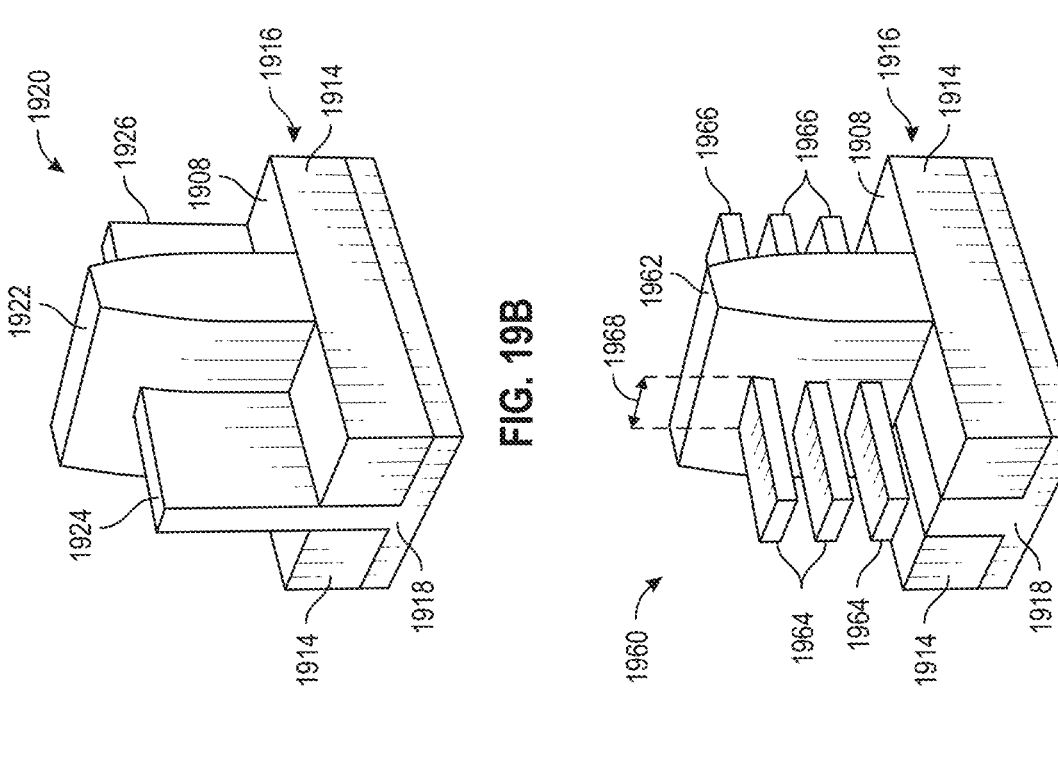
FIG. 19B
FIG. 19D
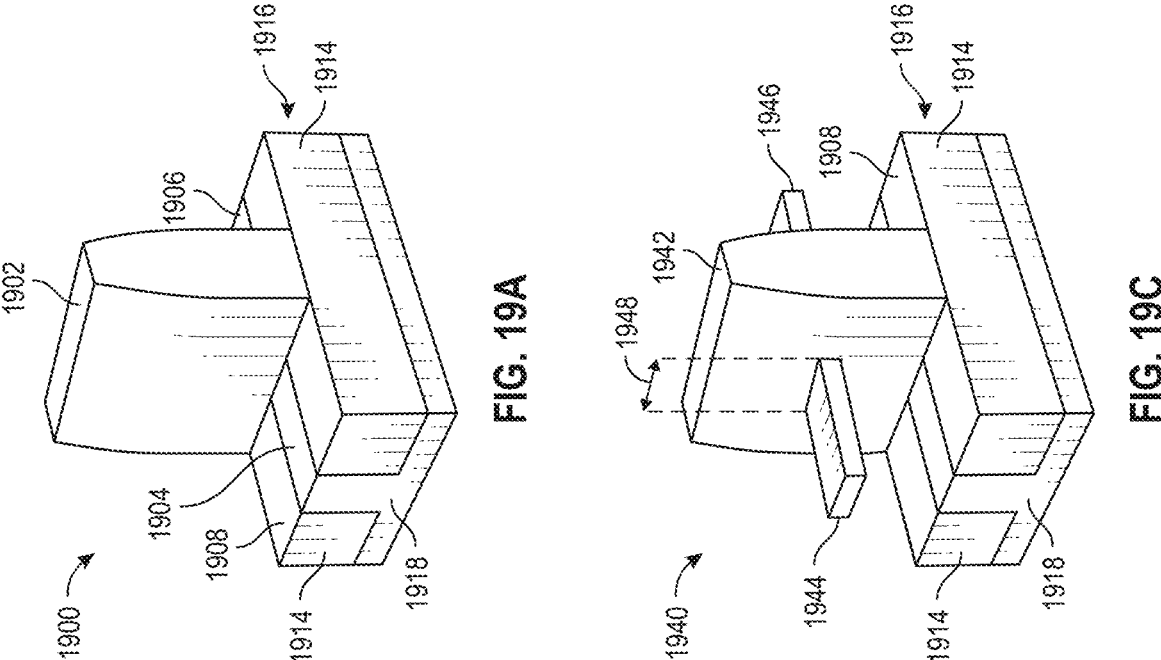
FIG. 19A
FIG. 19C

TECHNOLOGIES FOR VERTICALLY INTERCONNECTED GLASS CORE ARCHITECTURE

BACKGROUND

The demand for miniaturization of form factor and increased level of integration for high performance are driving sophisticated packaging techniques in the semiconductor industry. Die partitioning enables miniaturization of small form factor and high performance without yield issues, but such an approach requires fine die to die connections. Bridge dies that provide fine interconnects between other dies can enable lower cost packaging.

BRIEF DESCRIPTION OF THE DRAWINGS

FIGS. 19A-19D are perspective views of example planar, gate-all-around, and stacked gate-all-around transistors.

DETAILED DESCRIPTION

Figure 1:
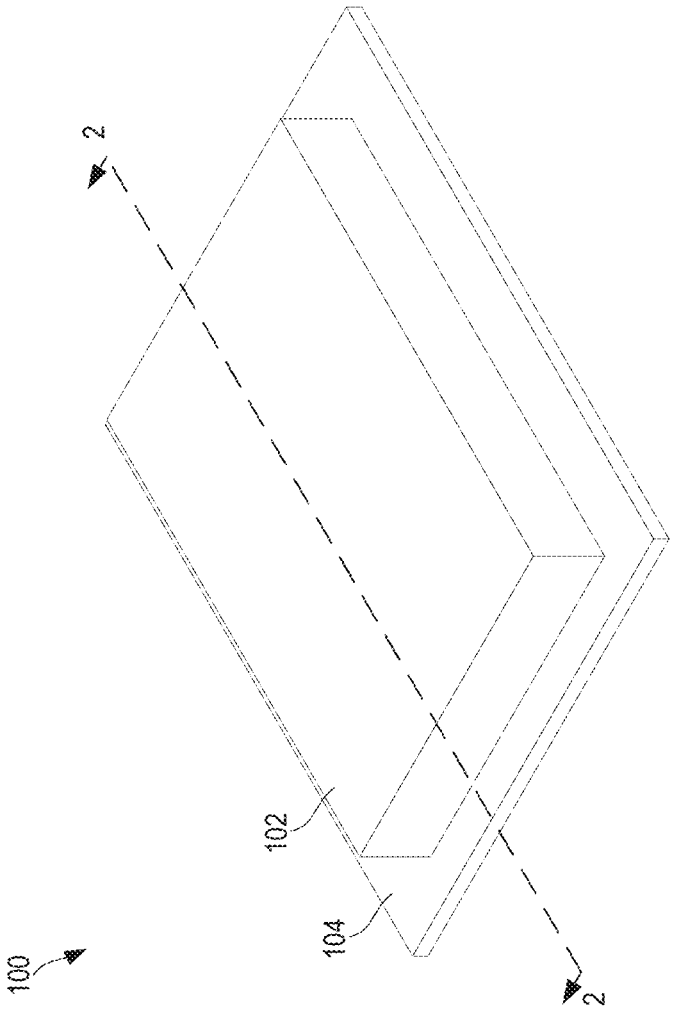
FIG. 1 is an isometric view of an integrated circuit component.
Figure 1:

In various embodiments disclosed herein, an integrated circuit component includes a glass layer between layers of integrated circuit dies. The glass layer has a cavity, in which a bridge die is positioned. The bridge die can provide interconnects between various components, such as between the dies of the integrated circuit component or between a die and a connection external to the integrated circuit component. The glass layer and bridge die can enable three-dimensional heterogeneous integration, allowing for fine pitch connections between dies.

As used herein, the phrase "communicatively coupled" refers to the ability of a component to send a signal to or receive a signal from another component. The signal can be any type of signal, such as an input signal, an output signal, or a power signal. A component can send or receive a signal to another component to which it is communicatively coupled via a wired or wireless communication medium (e.g., conductive traces, conductive contacts, air). Examples of components that are communicatively coupled include integrated circuit dies located in the same package that communicate via an embedded bridge in a package substrate and an integrated circuit component attached to a printed circuit board that send signals to or receives signals from other integrated circuit components or electronic devices attached to the printed circuit board.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact, and "coupled" may indicate elements co-operate or interact, but they may or may not be in direct physical or electrical contact. Furthermore, the terms "comprising," "including," "having," and the like, as used with respect to embodiments of the present disclosure, are synonymous. Terms modified by the word "substantially" include arrangements, orientations, spacings, or positions that vary slightly from the meaning of the unmodified term. For example, the central axis of a magnetic plug that is substantially coaxially aligned with a through hole may be misaligned from a central axis of the through hole by several degrees. In another example, a substrate assembly feature, such as a through width, that is described as having substantially a listed dimension can vary within a few percent of the listed dimension.

It will be understood that in the examples shown and described further below, the figures may not be drawn to scale and may not include all possible layers and/or circuit components. In addition, it will be understood that although certain figures illustrate transistor designs with source/drain regions, electrodes, etc. having orthogonal (e.g., perpendicular) boundaries, embodiments herein may implement such boundaries in a substantially orthogonal manner (e.g., within +/−5 or 10 degrees of orthogonality) due to fabrication methods used to create such devices or for other reasons.

Reference is now made to the drawings, which are not necessarily drawn to scale, wherein similar or same numbers may be used to designate the same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

In the following description, for purposes of explanation, numerous specific details are set forth in order to provide a thorough understanding thereof. It may be evident, however, that the novel embodiments can be practiced without these specific details. In other instances, well-known structures and devices are shown in block diagram form in order to facilitate a description thereof. The intention is to cover all modifications, equivalents, and alternatives within the scope of the claims.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

Figure 2:
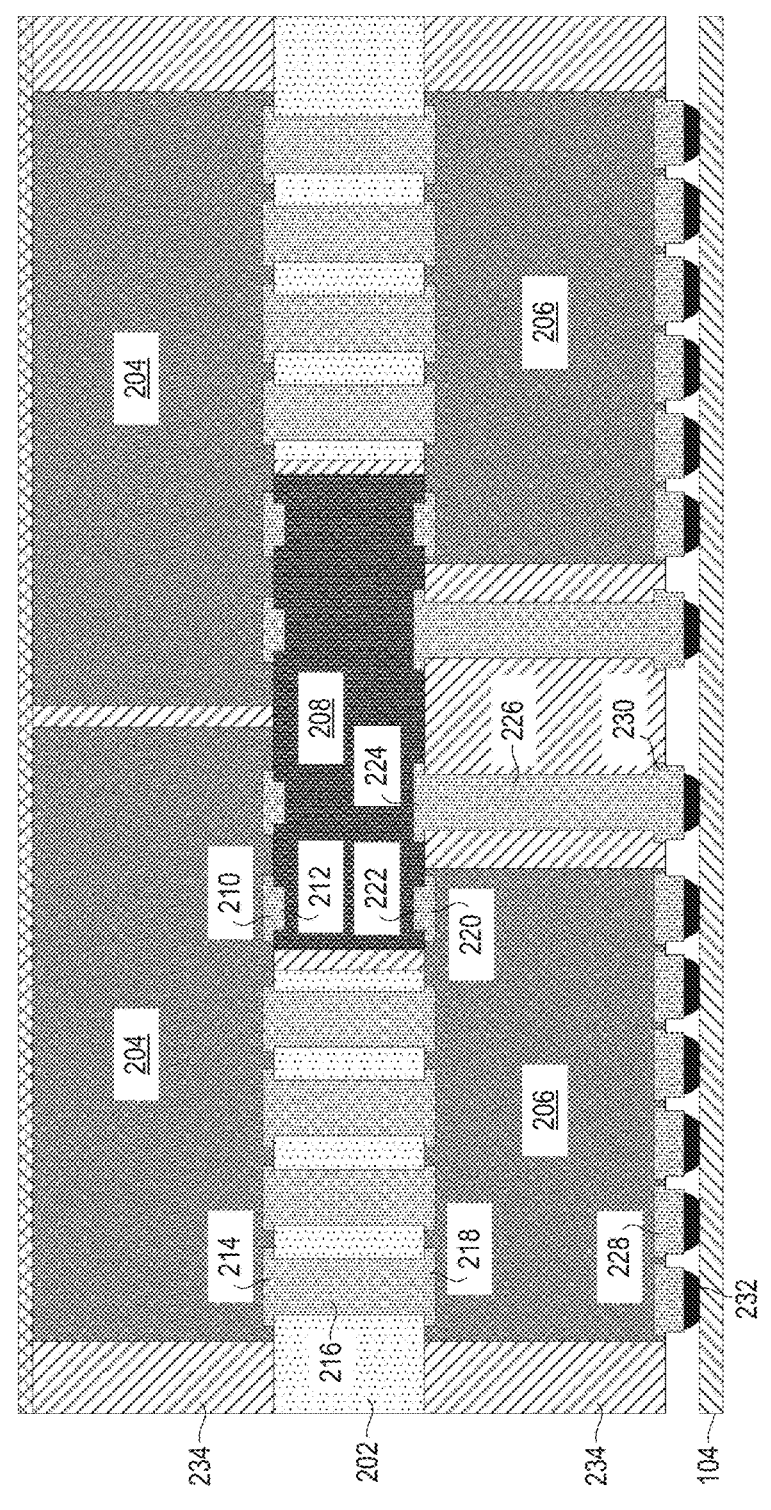
FIG. 2 is a cross-sectional view of one embodiment of part of the integrated circuit component of FIG. 1.

Referring now to FIGS. 1 and 2, in one embodiment, an integrated circuit component 100 includes a die assembly 102 and a substrate. FIG. 1 shows a perspective view of the integrated circuit component 100, and FIG. 2 shows a cross-sectional view of part of the integrated circuit component 100. The integrated circuit component 100 may be embodied as, included in, or include any suitable component or device, such as an electronic integrated circuit, a photonic integrated circuit, a processor module, a memory module, an application-specific integrated circuit, a field-programmable gate array (FPGA), a graphics processor, an accelerator, etc.

The illustrative substrate 104 may be embodied as a circuit board made from ceramic, glass, and/or organic-based materials with fiberglass and resin, such as FR-4. The circuit board 104 may have any suitable length or width, such as 10-500 millimeters. The circuit board 104 may have any suitable thickness, such as 0.2-5 millimeters. The circuit board 104 may support additional components besides the die assembly 102, such as additional electronic or photonic integrated circuit components, a processor unit, a memory device, an accelerator device, etc. The substrate 104 may embodied as any other suitable material, such as silicon. The integrated circuit component 100 may include a mid-level interconnect that connects to a substrate or a second-level interconnect that connects to a board, such as a motherboard. In some embodiments, the integrated circuit component 100 may not include a separate substrate 104.

As shown in FIG. 1, in the illustrative embodiment, the die assembly 102 may be covered by, e.g., a integrated heat spreader. In other embodiments, the various components of the die assembly 102 may not be covered or sealed.

Referring now to FIG. 2, a cross-sectional view of part of the integrated circuit component 100 is shown. The integrated circuit component 100 includes one or more integrated circuit dies 204, with mold 234 around the dies 204. The dies 204 are adjacent the top side of a glass layer 202. Integrated circuit dies 206 are also positioned adjacent a bottom side of the glass layer 202. A bridge die 208 is positioned in a cavity in the glass layer 202. The dies 204, 206 have contact pads 210, 220, respectively, for various electrical connections to the bridge die 208, such as signal connections or power connections. The bridge die 208 similarly has contact pads 212 for connections to the dies 204 and contact pads 222 for connections to the dies 206.

The dies 204 also include additional contact pads 214 for additional connections, such as connections to contact pads 218 on the dies 206 that are connected with through glass vias 216. The bridge die 208 may also include contact pads 224 for connections to contact pads 230 on the bottom of the die assembly 102, which are connected through pillars 226. The dies 206 may also have contact pads 228 connected to solder bumps 232, which can be used to mate the die assembly 102 with the substrate 104. In the illustrative embodiment, the various contact pads 214, 210, 212, 218, 220, 228 and pillars 216, 226 are copper. In other embodiments, they may be a different metal. The pillars 216, 226 or other vias through the glass layer 202 may have any suitable aspect ratio, such as an aspect ratio of up to 10:1 or higher.

The dies 204, 206 may be any suitable integrated circuit dies, such as electrical integrated circuits, photonic integrated circuits, high-bandwidth memory circuits, a processor die, an application-specific integrated circuit die, a field-programmable gate array (FPGA) die, a graphics processor die, an accelerator die, etc. In one illustrative embodiment, the dies 204 are high-bandwidth memory and the dies 206 are supporting integrated circuit dies.

The bridge die 208 provides interconnect circuitry for connections between the dies 204, 206. The bridge die 208 may be embodied as, e.g., an embedded multi-die interconnect bridge (EMIB) or an omni-directional interconnect (ODI).

The glass layer 202 may be any suitable material, such as silicon oxide, fused silica, quartz, borosilicate glass, etc. The glass layer 202 may have any suitable thickness, such as 50 micrometers to 2 millimeters.

In the illustrative embodiment, the total thickness variation of the glass layer is low, allowing for the bonds between the various contact pads 214, 210, 212, 218, 220, 228 and pillars 216, 226 to be formed as hybrid bonds. In the illustrative embodiment, the silicon in the dies 204, 206 and the glass layer 202 form a bond, and the copper in the various contact pads 214, 210, 212, 218, 220, 228 and pillars 216, 226 cause them to bond to each other. In other embodiments, other types of hybrid bonds may be used. For example, in some embodiments, polyimide may be deposited on each surface before the dis 204 and the glass layer 202 are brought together. During the hybrid bonding process, the polyimide on the two surfaces may form a bond. In some embodiments, some or all of the bonds between various contact pads 214, 210, 212, 218, 220, 228 and pillars 216, 226 may be solder bonds.

Figure 3:
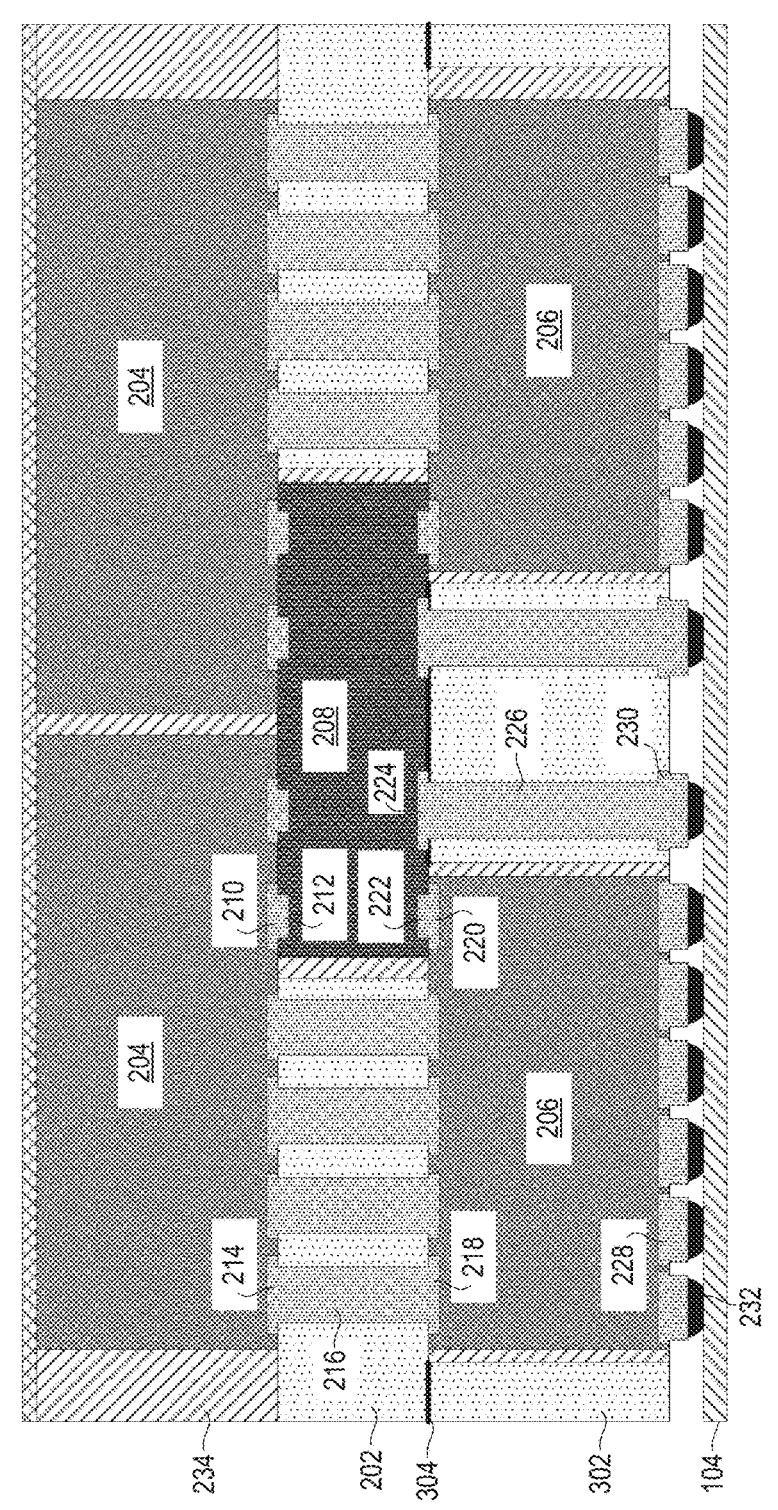
FIG. 3 is a cross-sectional view of one embodiment of part of the integrated circuit component of FIG. 1.
Figure 4:
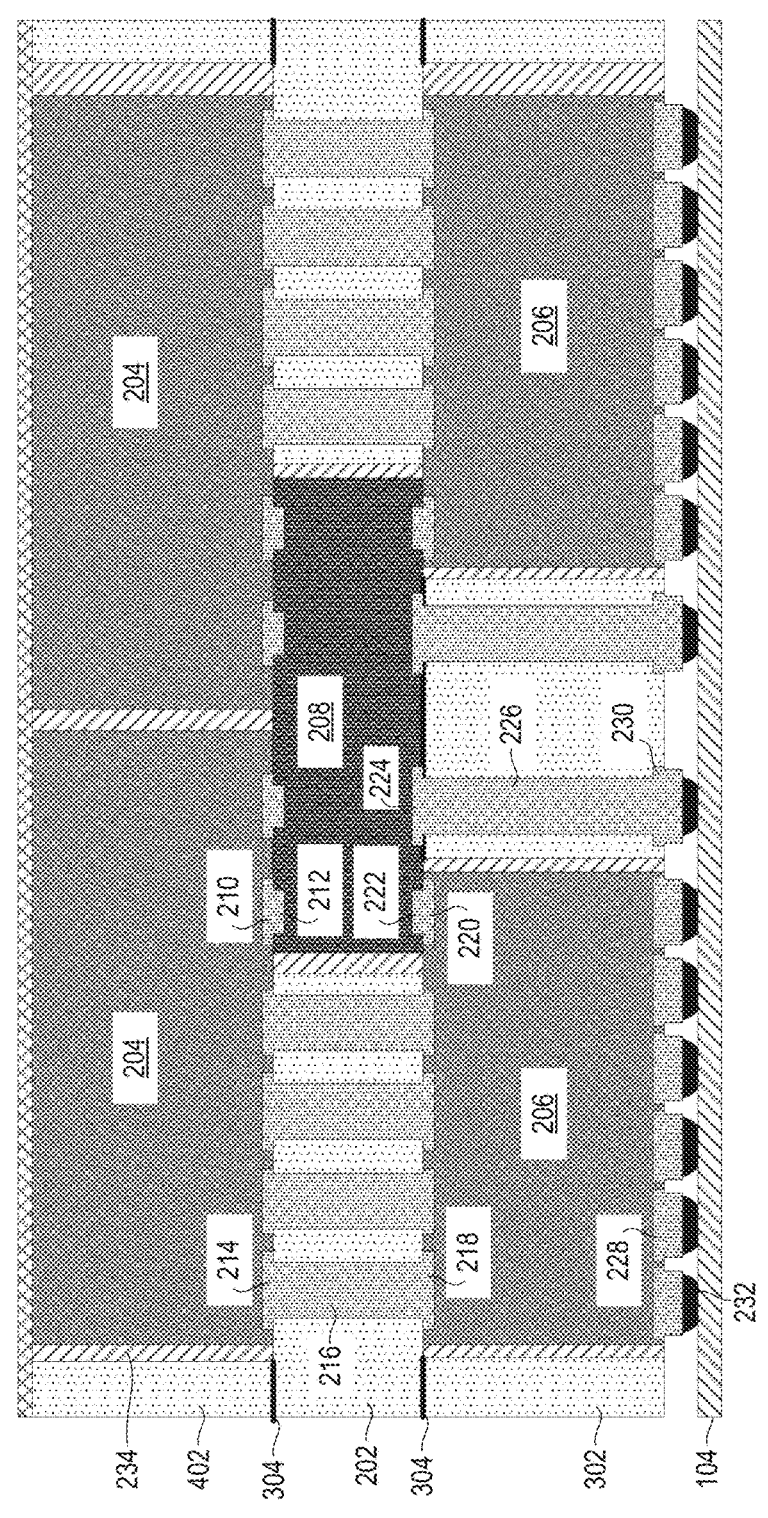
FIG. 4 is a cross-sectional view of one embodiment of part of the integrated circuit component of FIG. 1.
Figure 5:
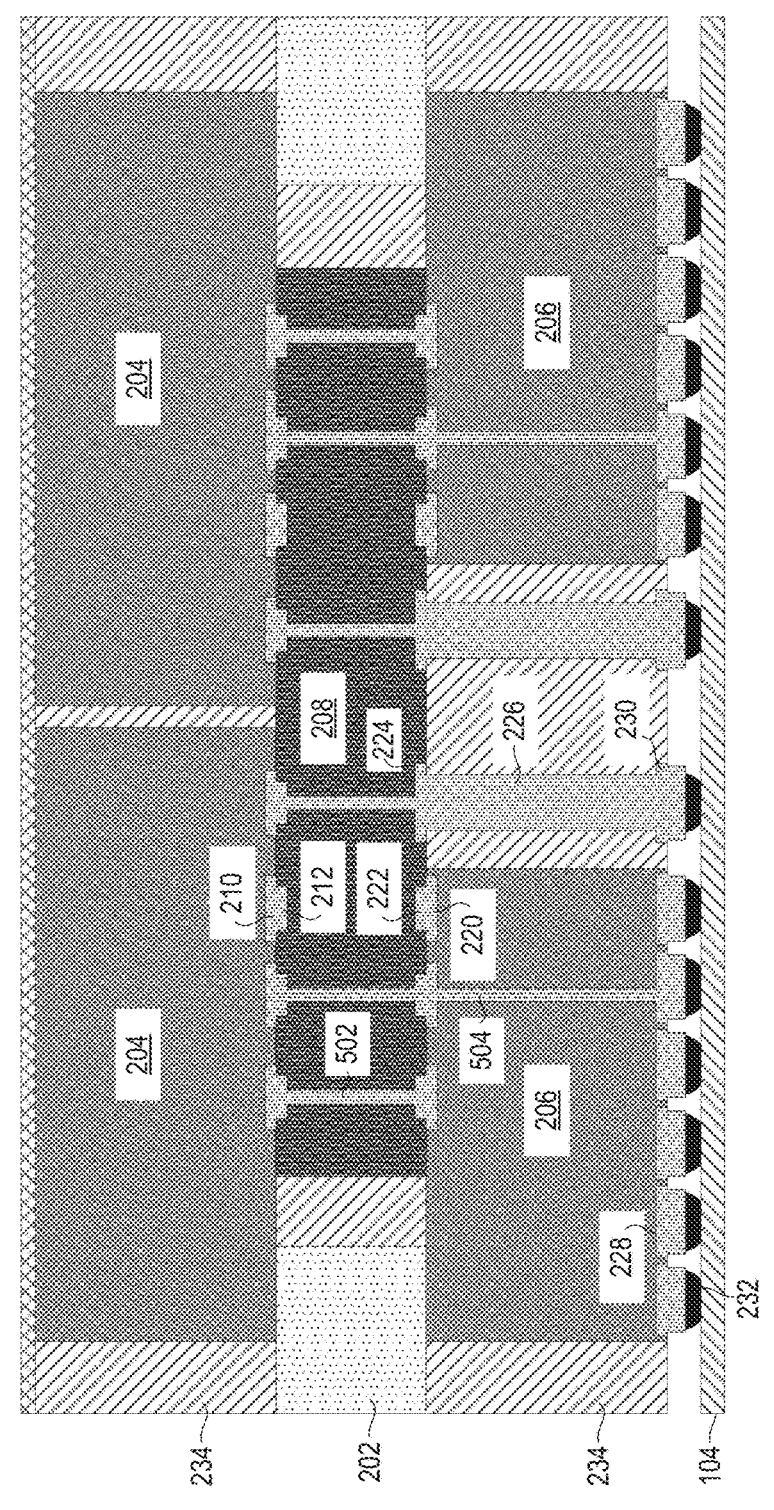
FIG. 5 is a cross-sectional view of one embodiment of part of the integrated circuit component of FIG. 1.

Referring now to FIG. 3, in one embodiment, some of the mold 234 surrounding the dies 206 below the glass layer 202 may be replaced with another glass layer 302. In some embodiments, the glass layer 302 may be bonded to the glass layer 202 using a bond film 304. In other embodiments, the glass layer 302 may be bonded to the glass layer 202 using glass fusion techniques. In another embodiment, as shown in FIG. 4, some of the mold 234 surrounding the dies 204 above the glass layer 202 may also be replaced with another glass layer 402. The glass layer 402 may be bonded to the glass layer 202 in similar manner as the glass layer 302. In another embodiment, shown in FIG. 5, the bridge die 208 may include through silicon vias 502 and/or the dies 206 may include through silicon vias 504.

The use of the glass layers 302, 402 may improve rigidity and/or increase functionality such as allowing for fabrication of an optical waveguide in the glass layers 302, 402 or incorporation of cavity filters in the glass layers 302, 402. In some embodiments, cavity filters or microchannels for thermal management may be incorporated within the glass layers 302, 402. Additionally or alternatively, the use of glass layers 302, 402 allows for high aspect ratio electrical connections through them.

It should be appreciated that some or all of the various embodiments of the integrated circuit component 100 described above include several advantages. The proposed architecture enables components of variable thickness to be bonded together or integrated into the architecture. For example, the thickness of the dies 204 may be different from the thickness of the dies 206, such as 10-50% thicker or thinner. The use of the glass layer 202 and the bridge die 208 enables a fine bump pitch of less than 25 micrometers and a correspondingly high interconnect density. The high cost dies 204, 206 and bridge die 208 are assembled together into a single patch, separate from any substrate, which is a form of z-disaggregation that may lead to lower cost.

Figure 6:
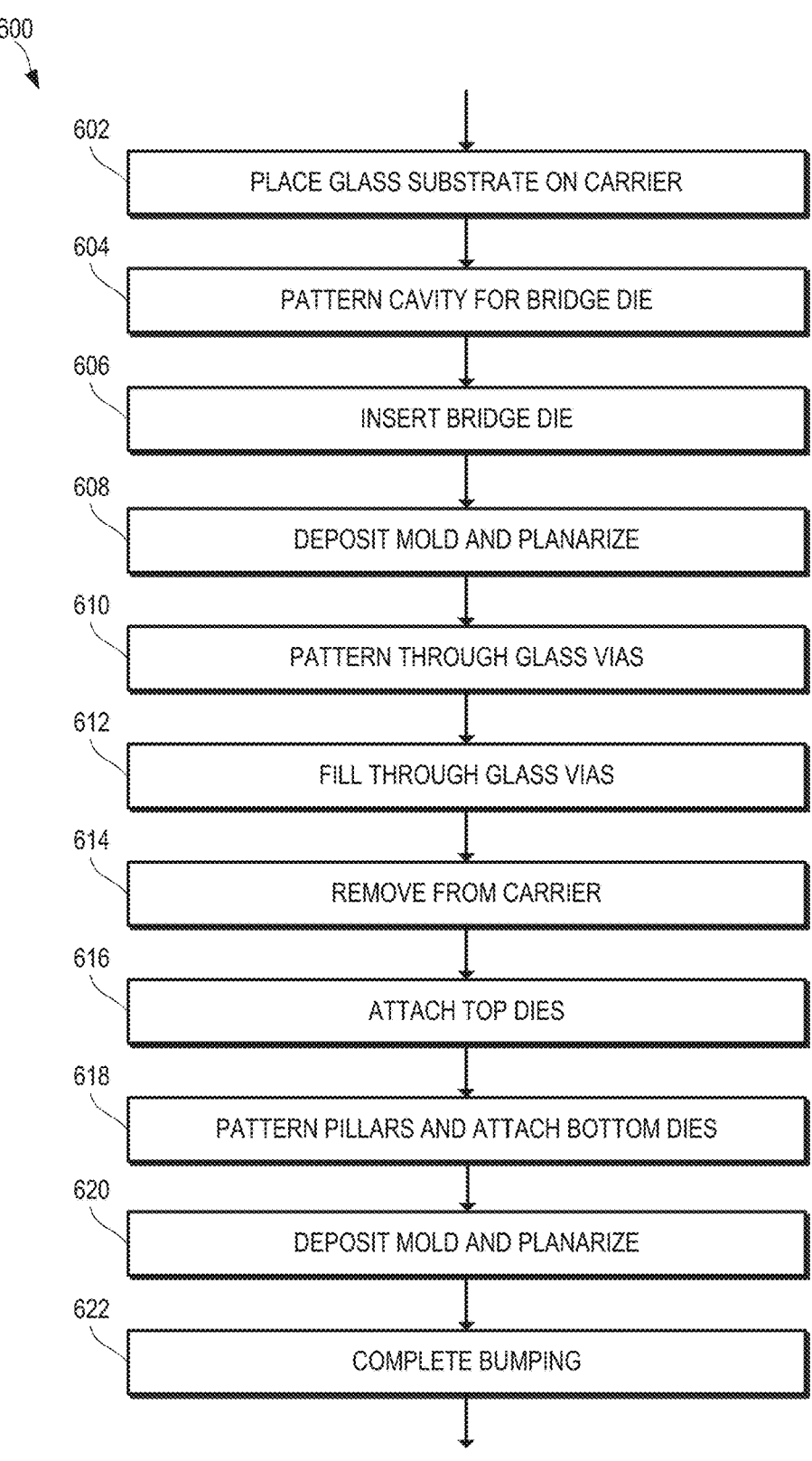
FIG. 6 is a simplified flow diagram of at least one embodiment of a method for manufacturing the integrated circuit component of FIG. 1.

Referring now to FIG. 6, in one embodiment, a flowchart for a method 600 for creating the integrated circuit component 100 with a glass layer 202 is shown. The method 600 may be executed by a technician and/or by one or more automated machines. In some embodiments, one or more machines may be programmed to do some or all of the steps of the method 600. Such a machine may include, e.g., a memory, a processor, data storage, etc. The memory and/or data storage may store instructions that, when executed by the machine, causes the machine to perform some or all of the steps of the method 600. The method 600 may use any suitable set of techniques that are used in semiconductor processing, such as chemical vapor deposition, atomic layer deposition, physical layer deposition, molecular beam epitaxy, layer transfer, photolithography, ion implantation, dry etching, wet etching, selective laser etching, thermal treatments, flip chip, magnetron sputter deposition, pulsed laser deposition, etc. It should be appreciated that the method 600 is merely one embodiment of a method to create one embodiment of the integrated circuit component 100, and other methods may be used to create any suitable embodiment of the integrated circuit component 100. In some embodiments, steps of the method 600 may be performed in a different order than that shown in the flowchart.

Figure 7:
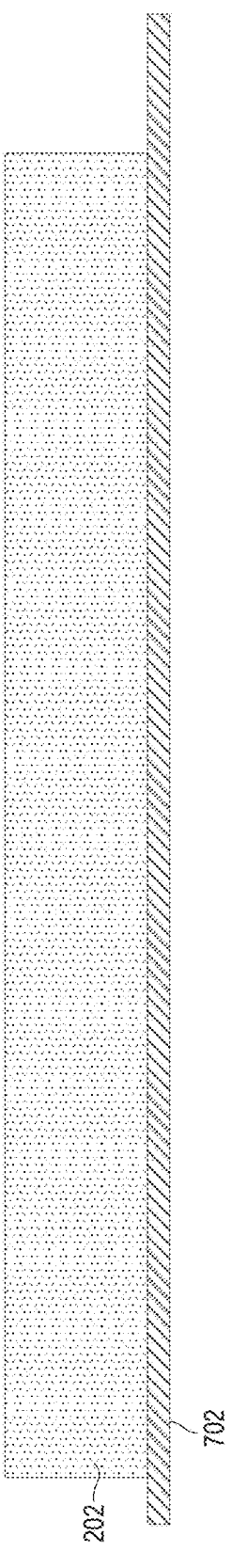
FIG. 7 shows one stage of a method of manufacturing the integrated circuit component of FIG. 1.
Figure 7:
Figure 8:
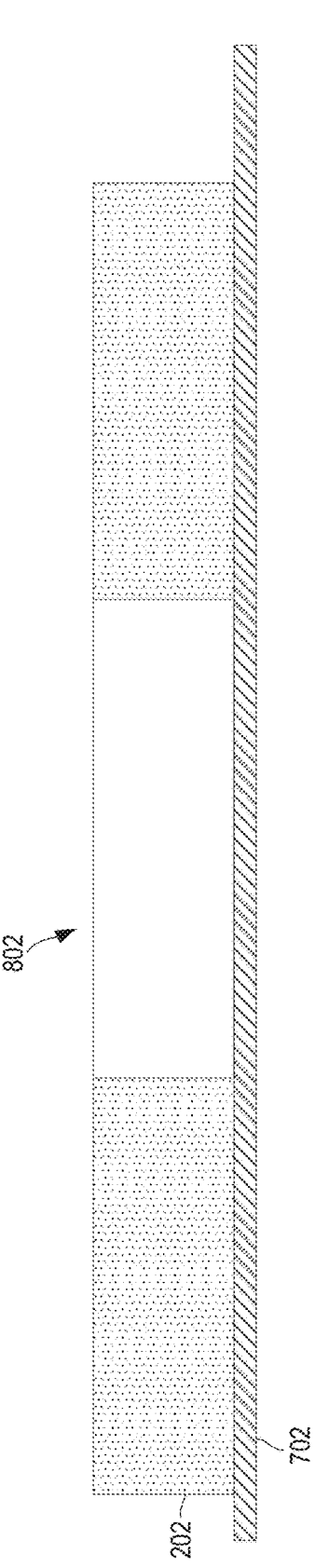
FIG. 8 shows one stage of a method of manufacturing the integrated circuit component of FIG. 1.

The method 600 begins in block 602, in which a glass layer 202 is placed on a carrier 702, as shown in FIG. 7. A cavity 802 is patterned in the glass layer 202 in block 604, as shown in FIG. 8.

Figure 9:
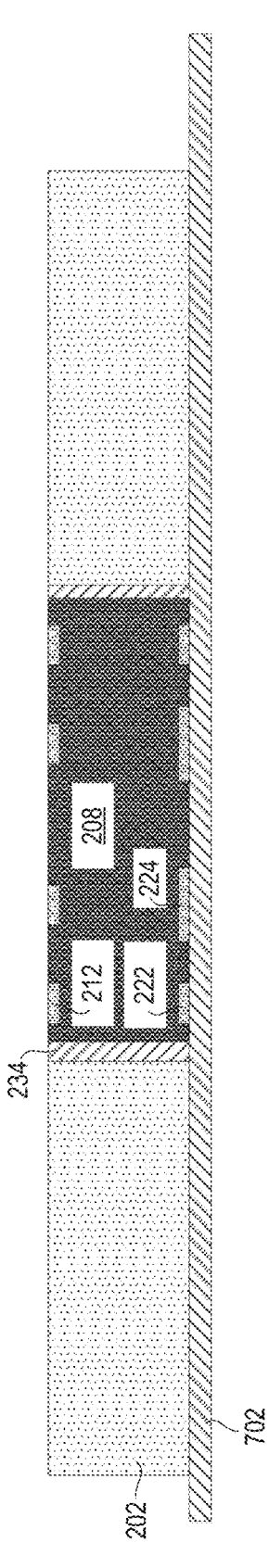
FIG. 9 shows one stage of a method of manufacturing the integrated circuit component of FIG. 1.
Figure 9:
Figure 10:
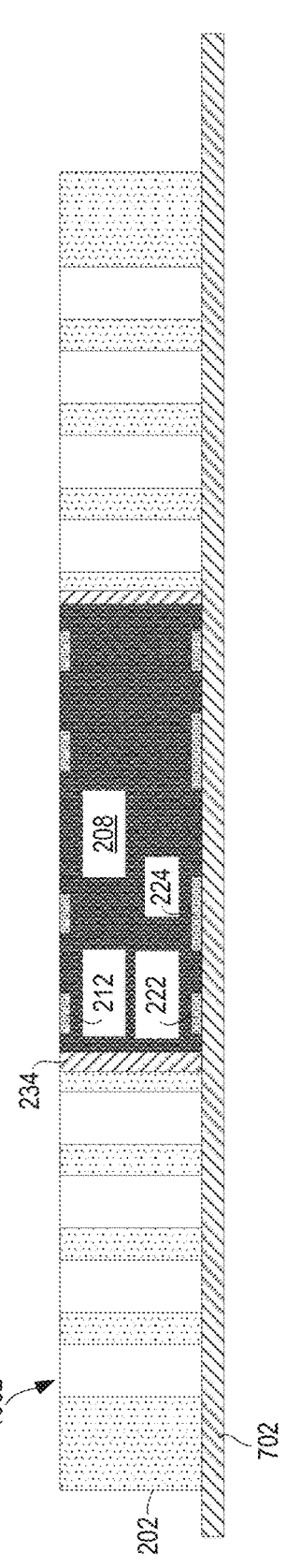
FIG. 10 shows one stage of a method of manufacturing the integrated circuit component of FIG. 1.
Figure 10:
Figure 11:
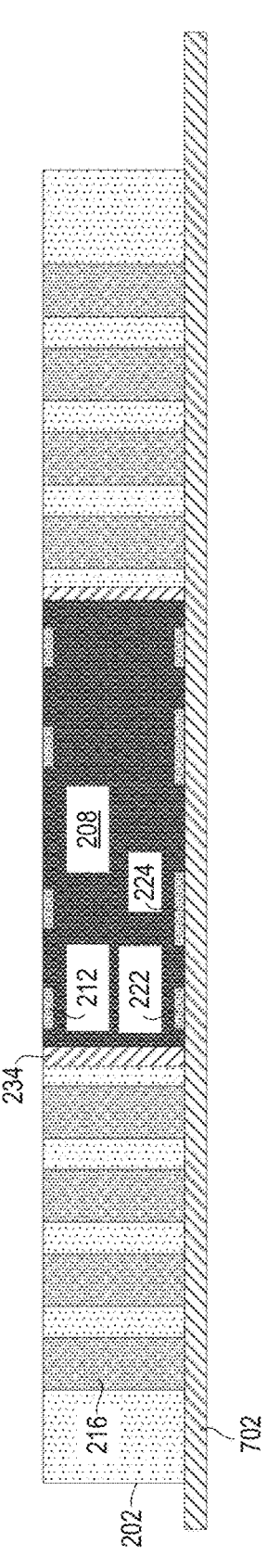
FIG. 11 shows one stage of a method of manufacturing the integrated circuit component of FIG. 1.

In block 606, a bridge die 208 is inserted into the cavity 802. In block 608, mold is deposited around the bridge die 208 and planarized, as shown in FIG. 9. In block 610, through glass vias 1002 are patterned in the glass layer 202, as shown in FIG. 10. The through glass vias 1002 may be made using, e.g., direct laser write, which allows for relatively high aspect ratio vias. In block 612, the through glass vias 1002 are filled with copper forming pillars 216, as shown in FIG. 11.

Figure 12:
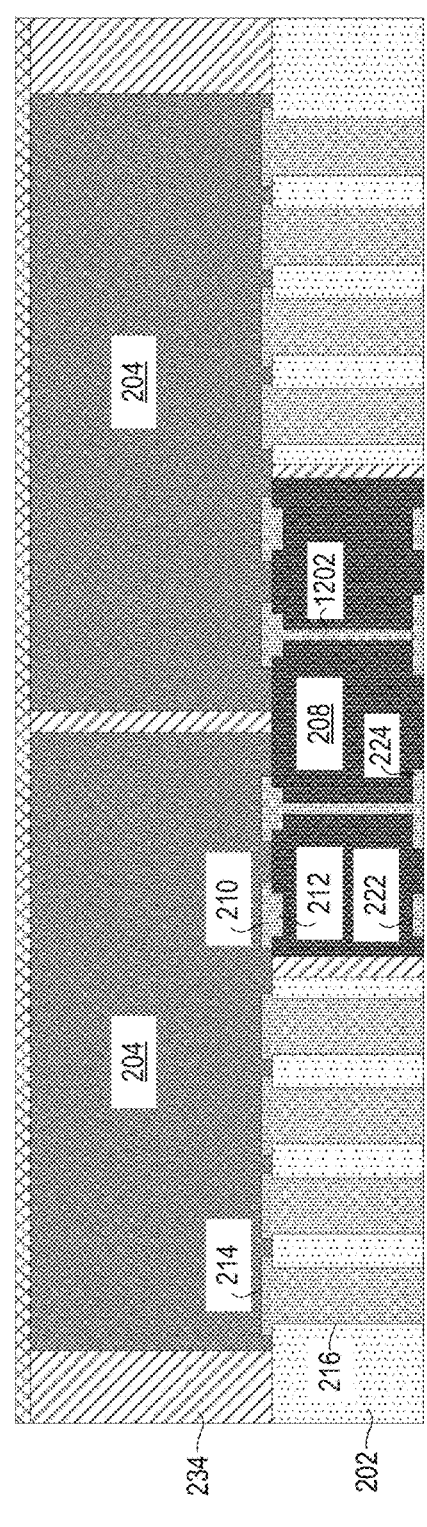
FIG. 12 shows one stage of a method of manufacturing the integrated circuit component of FIG. 1.

In block 614, the glass layer 202 and bridge die 208 are removed from the carrier 702. The top dies 204 are attached in block 616, as shown in FIG. 12. In the illustrative embodiment, the top dies 204 are attached using hybrid bonding. To establish a hybrid bond, the top dies 204 are placed on the glass layer 202 and bridge die 208. The temperature is increased to cause bonding between the silicon in the glass layer 202 and bridge die 208 to bond with silicon in the dies 204. The temperature is then further increased, causing the copper in the contact pads 210, 212, 214 to expand faster than the glass layer 202, bridge die 208, and dies 204, pressing the copper together until a bond is formed. A similar approach may be used to form hybrid bonds with polyimide by first depositing polyimide on surfaces of the glass layer 202 and silicon of the dies 204 and bridge die 208.

Figure 13:
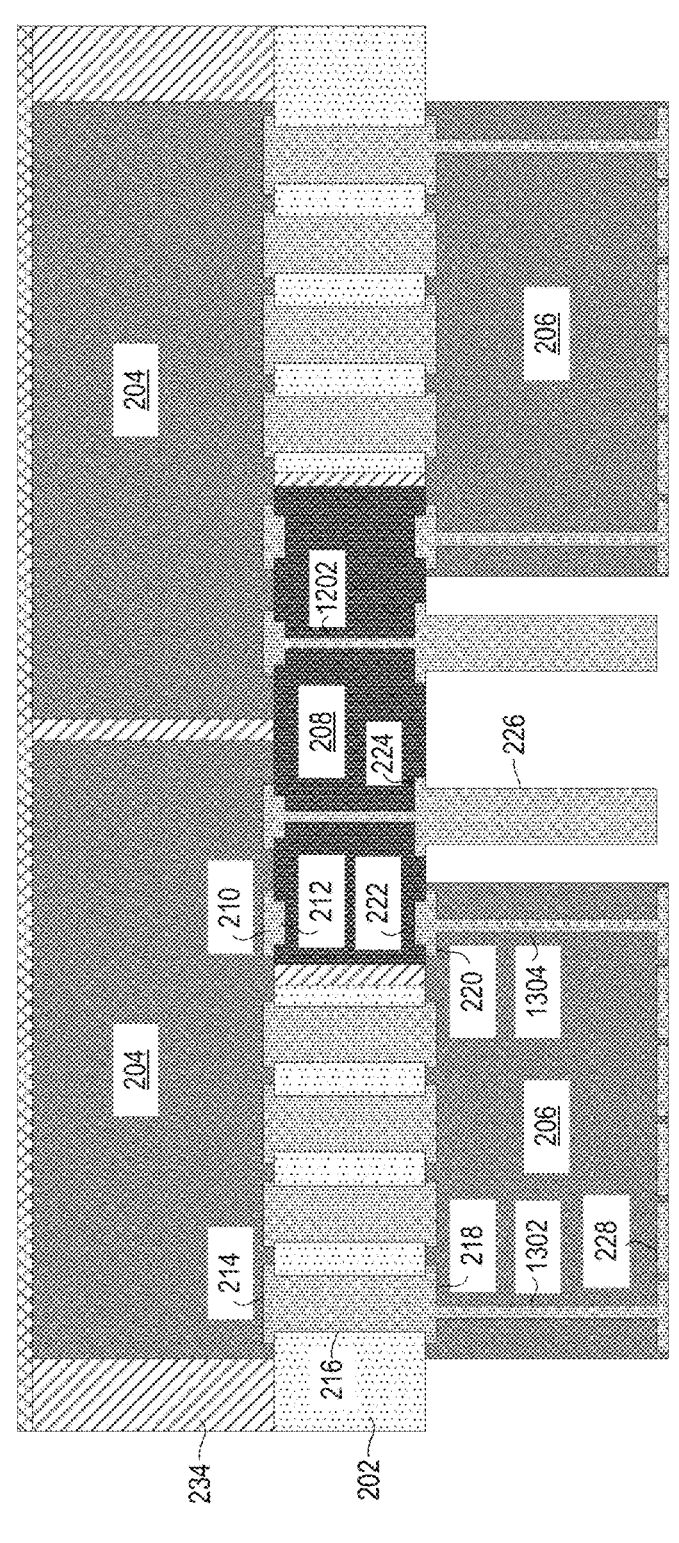
FIG. 13 shows one stage of a method of manufacturing the integrated circuit component of FIG. 1.
Figure 14:
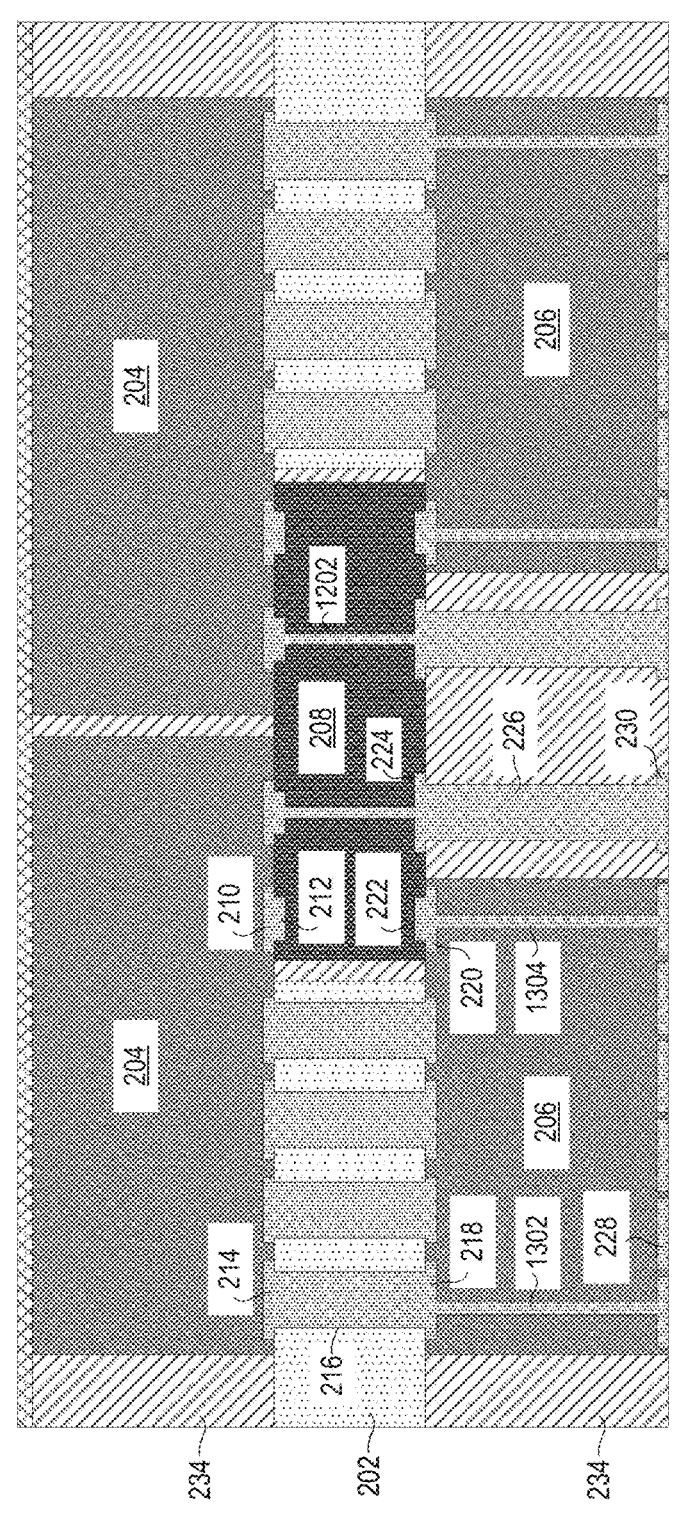
FIG. 14 shows one stage of a method of manufacturing the integrated circuit component of FIG. 1.
Figure 15:
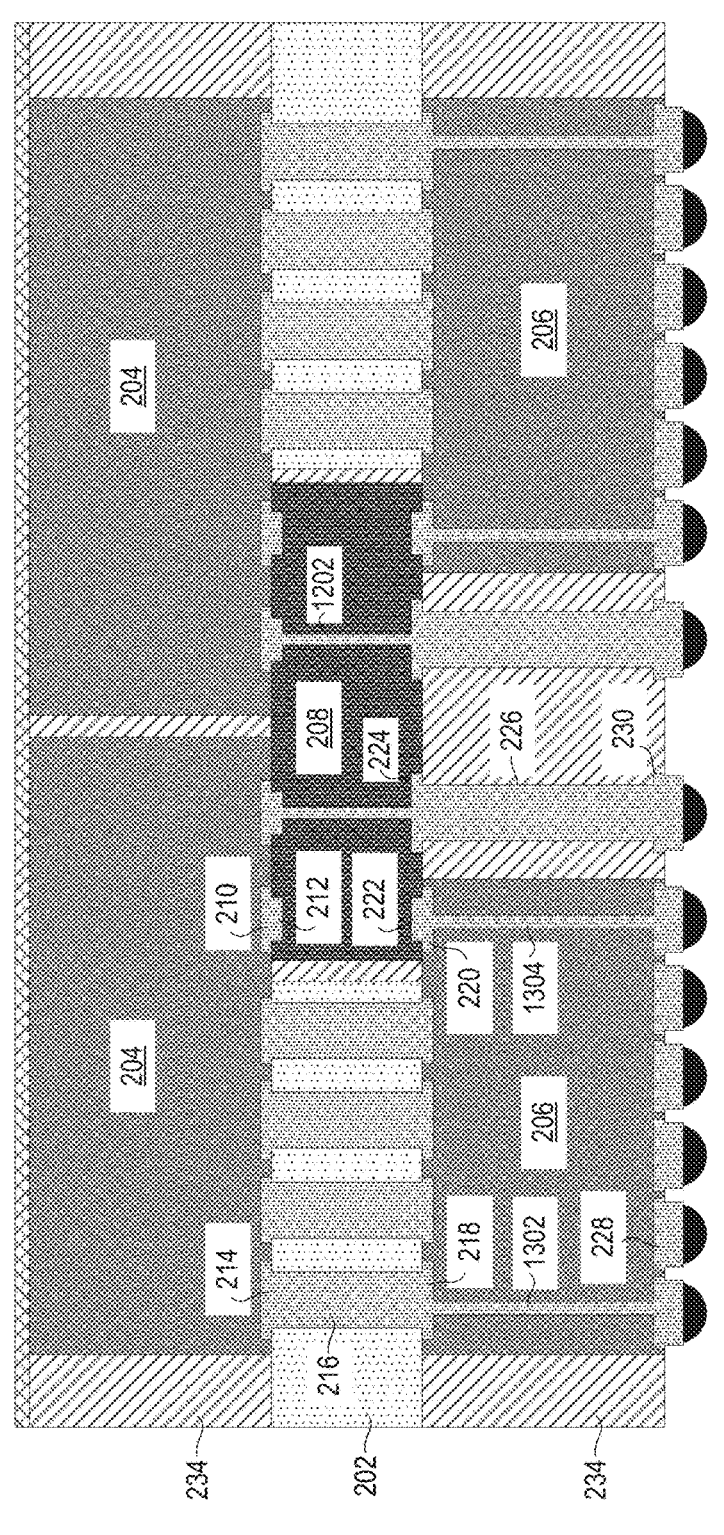
FIG. 15 shows one stage of a method of manufacturing the integrated circuit component of FIG. 1.

Pillars are patterned on the bridge die 208 and the bottoms dies 206 are attached in block 618, as shown in FIG. 13. In block 608, mold is deposited around the dies 206 and pillars 226 and planarized, as shown in FIG. 14. In block 622, the solder bumps 232 are added, as shown in FIG. 15. The die assembly 102 may then be integrated with, e.g., a substrate 104 or other component.

It should be appreciated that other process flows beyond the one described above are possible. For example, in some embodiments, the dies 204 may be encased in a glass layer 402 and/or the dies 206 may be encased in a glass layer 302 before being bonded to the glass layer 202 and bridge die 208.

Figure 16:
FIG. 16 is a cross-sectional view of one embodiment of part of the integrated circuit component of FIG. 1.

It should further be appreciated that the designs described above are merely several possible embodiments, and that any suitable combination of embodiments are envisioned as well as additional embodiments. For example, in one embodiment, an integrated circuit component 100 may include or be coupled to a heat sink 1602, as shown in FIG. 16. As the glass layer 202 may be a relatively poor thermal conductor, copper structures 1604 may be embedded in the glass layer 202 to improve heat transfer and dissipation.

Figure 17:
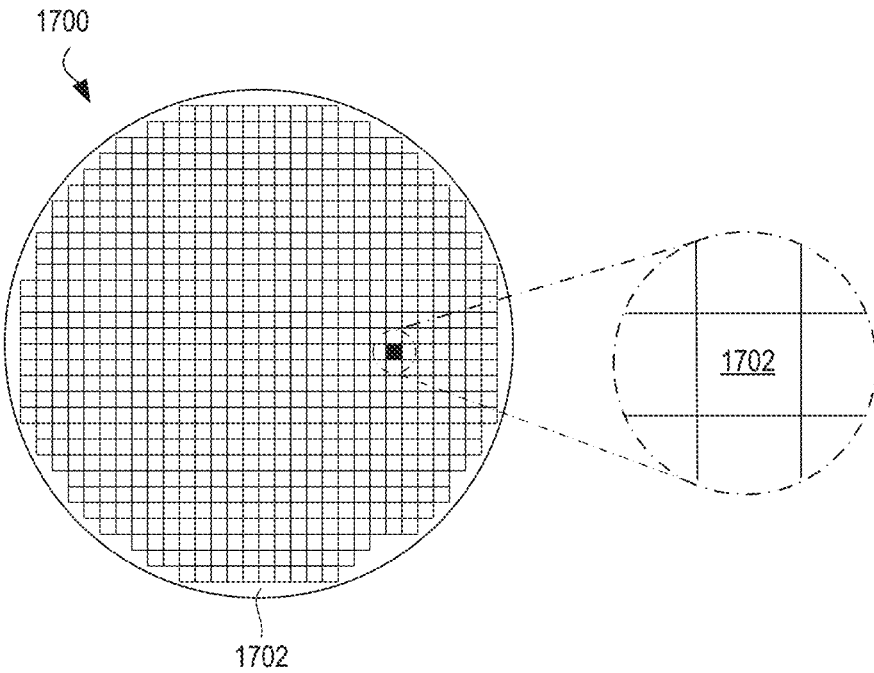
FIG. 17 is a top view of a wafer and dies that may be included in a microelectronic assembly, in accordance with any of the embodiments disclosed herein.

FIG. 17 is a top view of a wafer 1700 and dies 1702 that may be included in any of the integrated circuit components 100 disclosed herein (e.g., as any suitable ones of the dies 204). The wafer 1700 may be composed of semiconductor material and may include one or more dies 1702 having integrated circuit structures formed on a surface of the wafer 1700. The individual dies 1702 may be a repeating unit of an integrated circuit product that includes any suitable integrated circuit. After the fabrication of the semiconductor product is complete, the wafer 1700 may undergo a singulation process in which the dies 1702 are separated from one another to provide discrete "chips" of the integrated circuit product. The die 1702 may be any of the dies 202 disclosed herein. The die 1702 may include one or more transistors (e.g., some of the transistors 1840 of FIG. 18, discussed below), supporting circuitry to route electrical signals to the transistors, passive components (e.g., signal traces, resistors, capacitors, or inductors), and/or any other integrated circuit components. In some embodiments, the wafer 1700 or the die 1702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1702. For example, a memory array formed by multiple memory devices may be formed on a same die 1702 as a processor unit (e.g., the processor unit 2102 of FIG. 21) or other logic that is configured to store information in the memory devices or execute instructions stored in the memory array. Various ones of the integrated circuit components 100 disclosed herein may be manufactured using a die-to-wafer assembly technique in which some dies 204 are attached to a wafer 1700 that include others of the dies 204, and the wafer 1700 is subsequently singulated.

Figure 18:
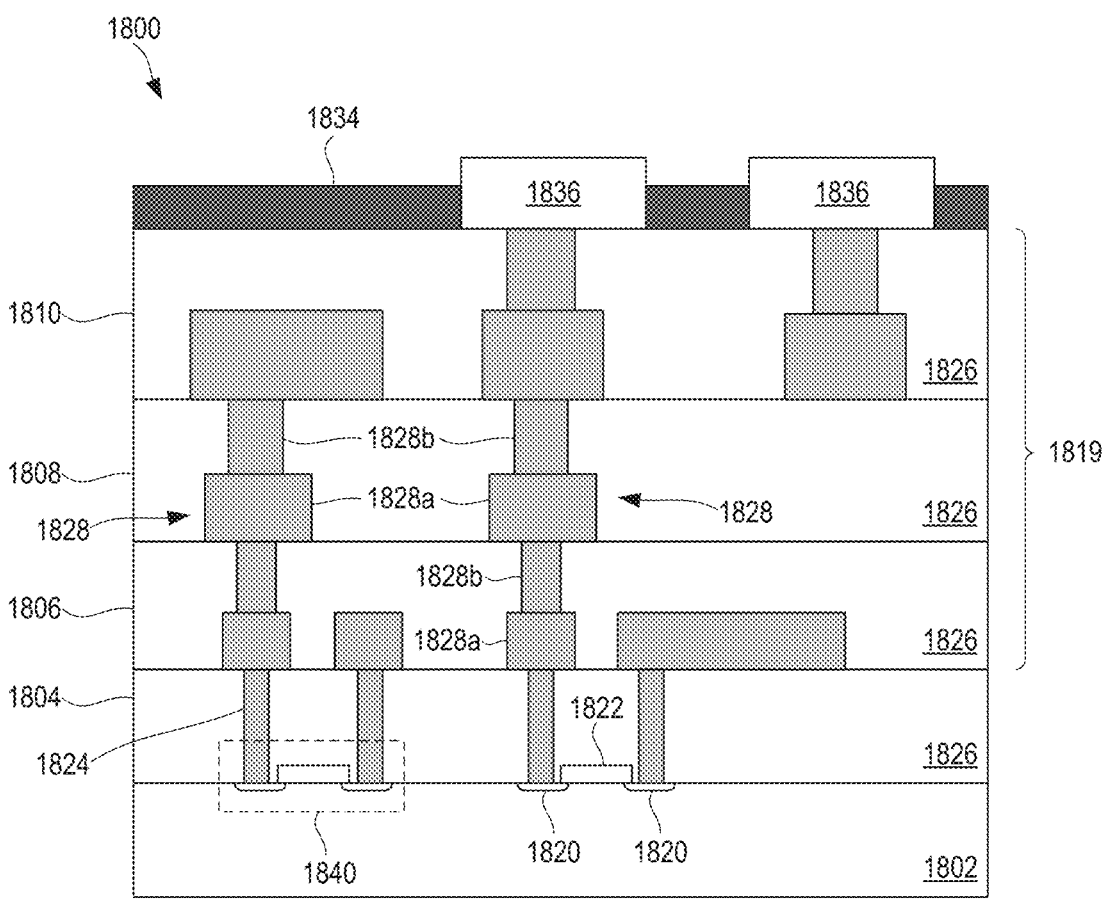
FIG. 18 is a cross-sectional side view of an integrated circuit device that may be included in a microelectronic assembly, in accordance with any of the embodiments disclosed herein.

FIG. 18 is a cross-sectional side view of an integrated circuit device 1800 that may be included in any of the integrated circuit components 100 disclosed herein (e.g., in any of the dies 204). One or more of the integrated circuit devices 1800 may be included in one or more dies 1702 (FIG. 17). The integrated circuit device 1800 may be formed on a die substrate 1802 (e.g., the wafer 1700 of FIG. 17) and may be included in a die (e.g., the die 1702 of FIG. 17). The die substrate 1802 may be a semiconductor substrate composed of semiconductor material systems including, for example, n-type or p-type materials systems (or a combination of both). The die substrate 1802 may include, for example, a crystalline substrate formed using a bulk silicon or a silicon-on-insulator (SOI) substructure. In some embodiments, the die substrate 1802 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1802. Although a few examples of materials from which the die substrate 1802 may be formed are described here, any material that may serve as a foundation for an integrated circuit device 1800 may be used. The die substrate 1802 may be part of a singulated die (e.g., the dies 1702 of FIG. 17) or a wafer (e.g., the wafer 1700 of FIG. 17).

The integrated circuit device 1800 may include one or more device layers 1804 disposed on the die substrate 1802. The device layer 1804 may include features of one or more transistors 1840 (e.g., metal oxide semiconductor field-effect transistors (MOSFETs)) formed on the die substrate 1802. The transistors 1840 may include, for example, one or more source and/or drain (S/D) regions 1820, a gate 1822 to control current flow between the S/D regions 1820, and one or more S/D contacts 1824 to route electrical signals to/from the S/D regions 1820. The transistors 1840 may include additional features not depicted for the sake of clarity, such as device isolation regions, gate contacts, and the like. The transistors 1840 are not limited to the type and configuration depicted in FIG. 18 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

FIGS. 19A-19D are simplified perspective views of example planar, FinFET, gate-all-around, and stacked gate-all-around transistors. The transistors illustrated in FIGS. 19A-19D are formed on a substrate 1916 having a surface 1908. Isolation regions 1914 separate the source and drain regions of the transistors from other transistors and from a bulk region 1918 of the substrate 1916.

FIG. 19A is a perspective view of an example planar transistor 1900 comprising a gate 1902 that controls current flow between a source region 1904 and a drain region 1906. The transistor 1900 is planar in that the source region 1904 and the drain region 1906 are planar with respect to the substrate surface 1908.

FIG. 19B is a perspective view of an example FinFET transistor 1920 comprising a gate 1922 that controls current flow between a source region 1924 and a drain region 1926. The transistor 1920 is non-planar in that the source region 1924 and the drain region 1926 comprise "fins" that extend upwards from the substrate surface 1928. As the gate 1922 encompasses three sides of the semiconductor fin that extends from the source region 1924 to the drain region 1926, the transistor 1920 can be considered a tri-gate transistor. FIG. 19B illustrates one S/D fin extending through the gate 1922, but multiple S/D fins can extend through the gate of a FinFET transistor.

FIG. 19C is a perspective view of a gate-all-around (GAA) transistor 1940 comprising a gate 1942 that controls current flow between a source region 1944 and a drain region 1946. The transistor 1940 is non-planar in that the source region 1944 and the drain region 1946 are elevated from the substrate surface 1928.

FIG. 19D is a perspective view of a GAA transistor 1960 comprising a gate 1962 that controls current flow between multiple elevated source regions 1964 and multiple elevated drain regions 1966. The transistor 1960 is a stacked GAA transistor as the gate controls the flow of current between multiple elevated S/D regions stacked on top of each other. The transistors 1940 and 1960 are considered gate-all-around transistors as the gates encompass all sides of the semiconductor portions that extends from the source regions to the drain regions. The transistors 1940 and 1960 can alternatively be referred to as nanowire, nanosheet, or nanoribbon transistors depending on the width (e.g., widths 1948 and 1968 of transistors 1940 and 1960, respectively) of the semiconductor portions extending through the gate.

Returning to FIG. 18, a transistor 1840 may include a gate 1822 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1840 along the source-channel-drain direction, the gate electrode may consist of a U-shaped structure that includes a bottom portion substantially parallel to the surface of the die substrate 1802 and two sidewall portions that are substantially perpendicular to the top surface of the die substrate 1802. In other embodiments, at least one of the metal layers that form the gate electrode may simply be a planar layer that is substantially parallel to the top surface of the die substrate 1802 and does not include sidewall portions substantially perpendicular to the top surface of the die substrate 1802. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1820 may be formed within the die substrate 1802 adjacent to the gate 1822 of individual transistors 1840. The S/D regions 1820 may be formed using an implantation/diffusion process or an etching/deposition process, for example. In the former process, dopants such as boron, aluminum, antimony, phosphorous, or arsenic may be ion-implanted into the die substrate 1802 to form the S/D regions 1820. An annealing process that activates the dopants and causes them to diffuse farther into the die substrate 1802 may follow the ion-implantation process. In the latter process, the die substrate 1802 may first be etched to form recesses at the locations of the S/D regions 1820. An epitaxial deposition process may then be carried out to fill the recesses with material that is used to fabricate the S/D regions 1820. In some implementations, the S/D regions 1820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1820 may be formed using one or more alternate semiconductor materials such as germanium or a group III-V material or alloy. In further embodiments, one or more layers of metal and/or metal alloys may be used to form the S/D regions 1820.

Electrical signals, such as power and/or input/output (I/O) signals, may be routed to and/or from the devices (e.g., transistors 1840) of the device layer 1804 through one or more interconnect layers disposed on the device layer 1804 (illustrated in FIG. 18 as interconnect layers 1806-1810). For example, electrically conductive features of the device layer 1804 (e.g., the gate 1822 and the S/D contacts 1824) may be electrically coupled with the interconnect structures 1828 of the interconnect layers 1806-1810. The one or more interconnect layers 1806-1810 may form a metallization stack (also referred to as an "ILD stack") 1819 of the integrated circuit device 1800.

The interconnect structures 1828 may be arranged within the interconnect layers 1806-1810 to route electrical signals according to a wide variety of designs; in particular, the arrangement is not limited to the particular configuration of interconnect structures 1828 depicted in FIG. 18. Although a particular number of interconnect layers 1806-1810 is depicted in FIG. 18, embodiments of the present disclosure include integrated circuit devices having more or fewer interconnect layers than depicted.

In some embodiments, the interconnect structures 1828 may include lines 1828*a* and/or vias 1828*b* filled with an electrically conductive material such as a metal. The lines 1828*a* may be arranged to route electrical signals in a direction of a plane that is substantially parallel with a surface of the die substrate 1802 upon which the device layer 1804 is formed. For example, the lines 1828*a* may route electrical signals in a direction in and out of the page and/or in a direction across the page. The vias 1828*b* may be arranged to route electrical signals in a direction of a plane that is substantially perpendicular to the surface of the die substrate 1802 upon which the device layer 1804 is formed. In some embodiments, the vias 1828*b* may electrically couple lines 1828*a* of different interconnect layers 1806-1810 together.

The interconnect layers 1806-1810 may include a dielectric material 1826 disposed between the interconnect structures 1828, as shown in FIG. 18. In some embodiments, dielectric material 1826 disposed between the interconnect structures 1828 in different ones of the interconnect layers 1806-1810 may have different compositions; in other embodiments, the composition of the dielectric material 1826 between different interconnect layers 1806-1810 may be the same. The device layer 1804 may include a dielectric material 1826 disposed between the transistors 1840 and a bottom layer of the metallization stack as well. The dielectric material 1826 included in the device layer 1804 may have a different composition than the dielectric material 1826 included in the interconnect layers 1806-1810; in other embodiments, the composition of the dielectric material 1826 in the device layer 1804 may be the same as a dielectric material 1826 included in any one of the interconnect layers 1806-1810.

A first interconnect layer 1806 (referred to as Metal 1 or "M1") may be formed directly on the device layer 1804. In some embodiments, the first interconnect layer 1806 may include lines 1828*a* and/or vias 1828*b*, as shown. The lines 1828*a* of the first interconnect layer 1806 may be coupled with contacts (e.g., the S/D contacts 1824) of the device layer 1804. The vias 1828*b* of the first interconnect layer 1806 may be coupled with the lines 1828*a* of a second interconnect layer 1808.

The second interconnect layer 1808 (referred to as Metal 2 or "M2") may be formed directly on the first interconnect layer 1806. In some embodiments, the second interconnect layer 1808 may include via 1828*b* to couple the lines 1828 of the second interconnect layer 1808 with the lines 1828*a* of a third interconnect layer 1810. Although the lines 1828*a* and the vias 1828*b* are structurally delineated with a line within individual interconnect layers for the sake of clarity, the lines 1828*a* and the vias 1828*b* may be structurally and/or materially contiguous (e.g., simultaneously filled during a dual-damascene process) in some embodiments.

The third interconnect layer 1810 (referred to as Metal 3 or "M3") (and additional interconnect layers, as desired) may be formed in succession on the second interconnect layer 1808 according to similar techniques and configurations described in connection with the second interconnect layer 1808 or the first interconnect layer 1806. In some embodiments, the interconnect layers that are "higher up" in the metallization stack 1819 in the integrated circuit device 1800 (i.e., farther away from the device layer 1804) may be thicker that the interconnect layers that are lower in the metallization stack 1819, with lines 1828*a* and vias 1828*b* in the higher interconnect layers being thicker than those in the lower interconnect layers.

The integrated circuit device 1800 may include a solder resist material 1834 (e.g., polyimide or similar material) and one or more conductive contacts 1836 formed on the interconnect layers 1806-1810. In FIG. 18, the conductive contacts 1836 are illustrated as taking the form of bond pads. The conductive contacts 1836 may be electrically coupled with the interconnect structures 1828 and configured to route the electrical signals of the transistor(s) 1840 to external devices. For example, solder bonds may be formed on the one or more conductive contacts 1836 to mechanically and/or electrically couple an integrated circuit die including the integrated circuit device 1800 with another component (e.g., a printed circuit board). The integrated circuit device 1800 may include additional or alternate structures to route the electrical signals from the interconnect layers 1806-1810; for example, the conductive contacts 1836 may include other analogous features (e.g., posts) that route the electrical signals to external components. The conductive contacts 1836 may serve as the conductive contacts 210, 212, 214, etc., as appropriate.

In some embodiments in which the integrated circuit device 1800 is a double-sided die, the integrated circuit device 1800 may include another metallization stack (not shown) on the opposite side of the device layer(s) 1804. This metallization stack may include multiple interconnect layers as discussed above with reference to the interconnect layers 1806-1810, to provide conductive pathways (e.g., including conductive lines and vias) between the device layer(s) 1804 and additional conductive contacts (not shown) on the opposite side of the integrated circuit device 1800 from the conductive contacts 1836. These additional conductive contacts may serve as the conductive contacts 210, 212, 214, etc., as appropriate.

In other embodiments in which the integrated circuit device 1800 is a double-sided die, the integrated circuit device 1800 may include one or more through silicon vias (TSVs) through the die substrate 1802; these TSVs may make contact with the device layer(s) 1804, and may provide conductive pathways between the device layer(s) 1804 and additional conductive contacts (not shown) on the opposite side of the integrated circuit device 1800 from the conductive contacts 1836. These additional conductive contacts may serve as the conductive contacts 210, 212, 214, etc., as appropriate. In some embodiments, TSVs extending through the substrate can be used for routing power and ground signals from conductive contacts on the opposite side of the integrated circuit device 1800 from the conductive contacts 1836 to the transistors 1840 and any other components integrated into the die 1800, and the metallization stack 1819 can be used to route I/O signals from the conductive contacts 1836 to transistors 1840 and any other components integrated into the die 1800.

Multiple integrated circuit devices 1800 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 20:
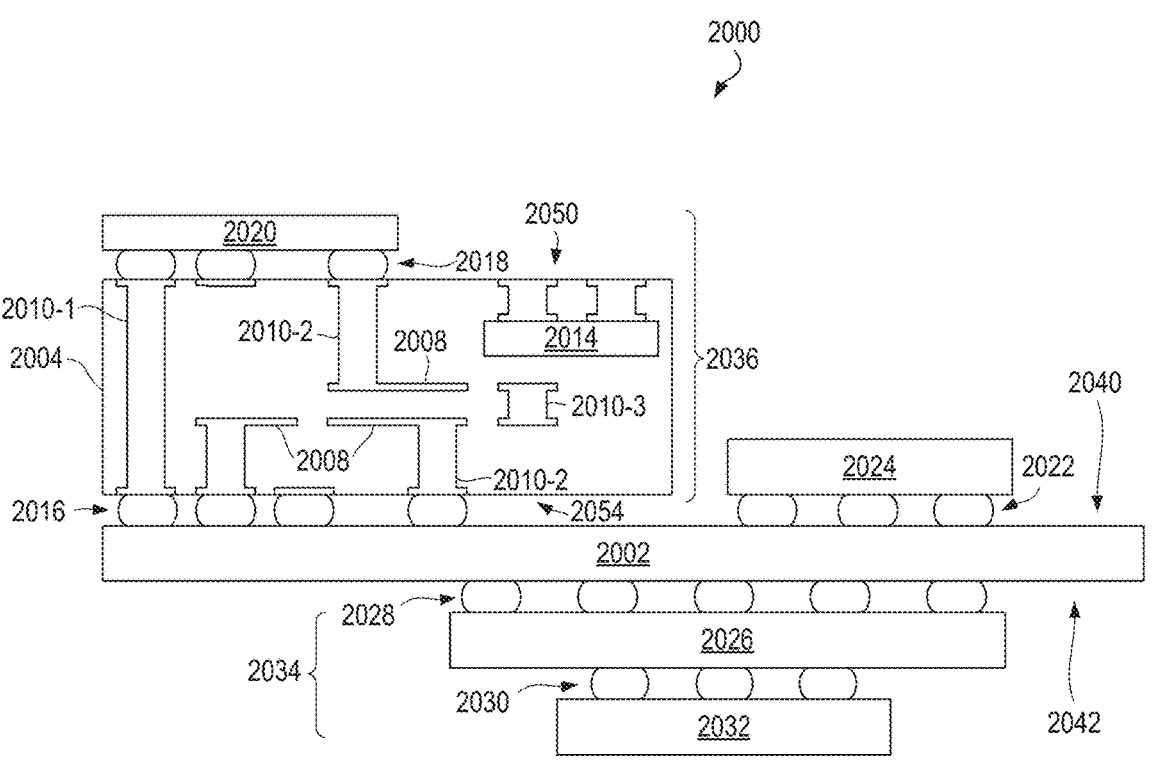
FIG. 20 is a cross-sectional side view of an integrated circuit device assembly that may include a microelectronic assembly, in accordance with any of the embodiments disclosed herein.

FIG. 20 is a cross-sectional side view of an integrated circuit device assembly 2000 that may include any of the integrated circuit components 100 disclosed herein. In some embodiments, the integrated circuit device assembly 2000 may be an integrated circuit component 100. The integrated circuit device assembly 2000 includes a number of components disposed on a circuit board 2002 (which may be a motherboard, system board, mainboard, etc.). The integrated circuit device assembly 2000 includes components disposed on a first face 2040 of the circuit board 2002 and an opposing second face 2042 of the circuit board 2002; generally, components may be disposed on one or both faces 2040 and 2042. Any of the integrated circuit components discussed below with reference to the integrated circuit device assembly 2000 may take the form of any suitable ones of the embodiments of the integrated circuit components 100 disclosed herein.

In some embodiments, the circuit board 2002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 2002. In other embodiments, the circuit board 2002 may be a non-PCB substrate. In some embodiments the circuit board 2002 may be, for example, the circuit board 104. The integrated circuit device assembly 2000 illustrated in FIG. 20 includes a package-on-interposer structure 2036 coupled to the first face 2040 of the circuit board 2002 by coupling components 2016. The coupling components 2016 may electrically and mechanically couple the package-on-interposer structure 2036 to the circuit board 2002, and may include solder balls (as shown in FIG. 20), pins (e.g., as part of a pin grid array (PGA), contacts (e.g., as part of a land grid array (LGA)), male and female portions of a socket, an adhesive, an underfill material, and/or any other suitable electrical and/or mechanical coupling structure. The coupling components 2016 may serve as the coupling components illustrated or described for any of the substrate assembly or substrate assembly components described herein, as appropriate.

The package-on-interposer structure 2036 may include an integrated circuit component 2020 coupled to an interposer 2004 by coupling components 2018. The coupling components 2018 may take any suitable form for the application, such as the forms discussed above with reference to the coupling components 2016. Although a single integrated circuit component 2020 is shown in FIG. 20, multiple integrated circuit components may be coupled to the interposer 2004; indeed, additional interposers may be coupled to the interposer 2004. The interposer 2004 may provide an intervening substrate used to bridge the circuit board 2002 and the integrated circuit component 2020.

The integrated circuit component 2020 may be a packaged or unpacked integrated circuit product that includes one or more integrated circuit dies (e.g., the die 1702 of FIG. 17, the integrated circuit device 1800 of FIG. 18) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 2020, a single monolithic integrated circuit die comprises solder bumps attached to contacts on the die. The solder bumps allow the die to be directly attached to the interposer 2004. The integrated circuit component 2020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 2020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 2020 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 2020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 2004 may spread connections to a wider pitch or reroute a connection to a different connection. For example, the interposer 2004 may couple the integrated circuit component 2020 to a set of ball grid array (BGA) conductive contacts of the coupling components 2016 for coupling to the circuit board 2002. In the embodiment illustrated in FIG. 20, the integrated circuit component 2020 and the circuit board 2002 are attached to opposing sides of the interposer 2004; in other embodiments, the integrated circuit component 2020 and the circuit board 2002 may be attached to a same side of the interposer 2004. In some embodiments, three or more components may be interconnected by way of the interposer 2004.

In some embodiments, the interposer 2004 may be formed as a PCB, including multiple metal layers separated from one another by layers of dielectric material and interconnected by electrically conductive vias. In some embodiments, the interposer 2004 may be formed of an epoxy resin, a fiberglass-reinforced epoxy resin, an epoxy resin with inorganic fillers, a ceramic material, or a polymer material such as polyimide. In some embodiments, the interposer 2004 may be formed of alternate rigid or flexible materials that may include the same materials described above for use in a semiconductor substrate, such as silicon, germanium, and other group III-V and group IV materials. The interposer 2004 may include metal interconnects 2008 and vias 2010, including but not limited to through hole vias 2010-1 (that extend from a first face 2050 of the interposer 2004 to a second face 2054 of the interposer 2004), blind vias 2010-2 (that extend from the first or second faces 2050 or 2054 of the interposer 2004 to an internal metal layer), and buried vias 2010-3 (that connect internal metal layers).

In some embodiments, the interposer 2004 can comprise a silicon interposer. Through silicon vias (TSV) extending through the silicon interposer can connect connections on a first face of a silicon interposer to an opposing second face of the silicon interposer. In some embodiments, an interposer 2004 comprising a silicon interposer can further comprise one or more routing layers to route connections on a first face of the interposer 2004 to an opposing second face of the interposer 2004.

The interposer 2004 may further include embedded devices 2014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 2004. The package-on-interposer structure 2036 may take the form of any of the package-on-interposer structures known in the art.

The integrated circuit device assembly 2000 may include an integrated circuit component 2024 coupled to the first face 2040 of the circuit board 2002 by coupling components 2022. The coupling components 2022 may take the form of any of the embodiments discussed above with reference to the coupling components 2016, and the integrated circuit component 2024 may take the form of any of the embodiments discussed above with reference to the integrated circuit component 2020.

The integrated circuit device assembly 2000 illustrated in FIG. 20 includes a package-on-package structure 2034 coupled to the second face 2042 of the circuit board 2002 by coupling components 2028. The package-on-package structure 2034 may include an integrated circuit component 2026 and an integrated circuit component 2032 coupled together by coupling components 2030 such that the integrated circuit component 2026 is disposed between the circuit board 2002 and the integrated circuit component 2032. The coupling components 2028 and 2030 may take the form of any of the embodiments of the coupling components 2016 discussed above, and the integrated circuit components 2026 and 2032 may take the form of any of the embodiments of the integrated circuit component 2020 discussed above. The package-on-package structure 2034 may be configured in accordance with any of the package-on-package structures known in the art.

Figure 21:
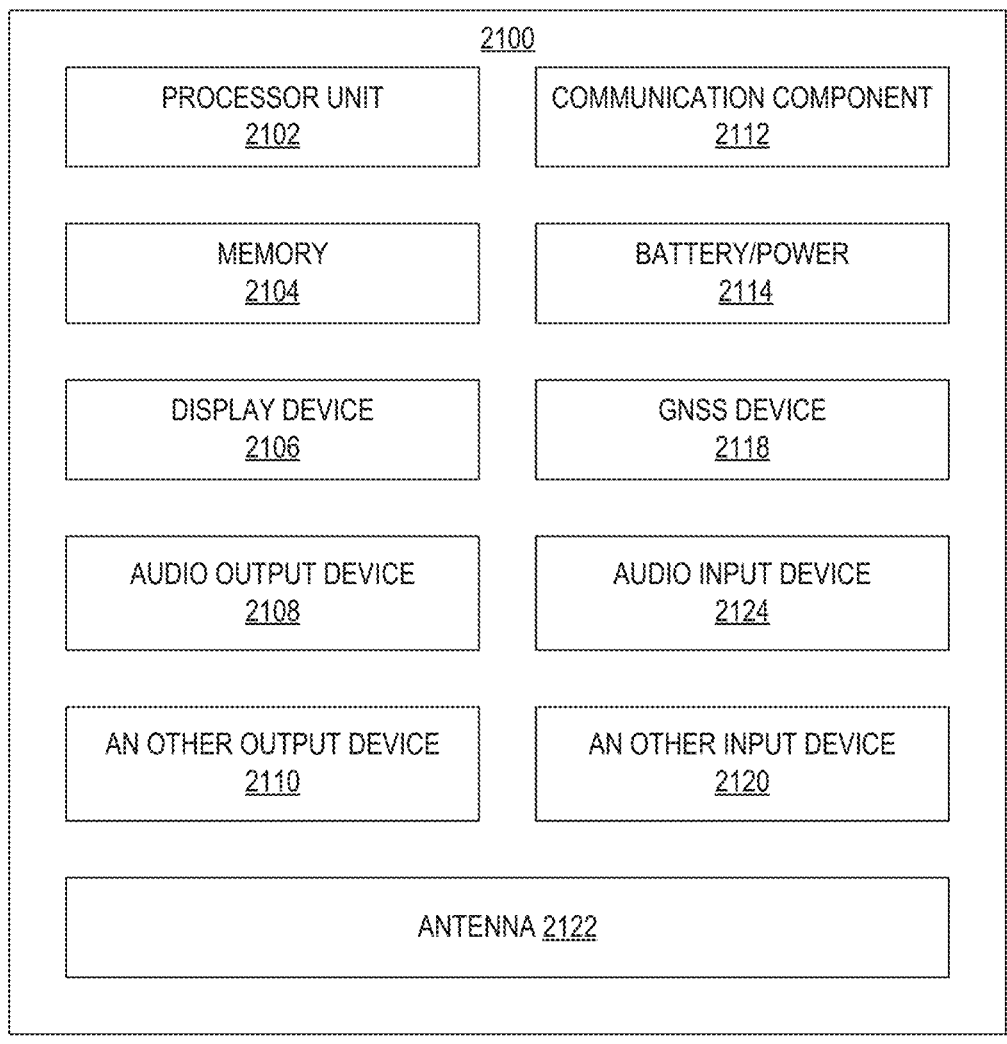
FIG. 21 is a block diagram of an example electrical device that may include a microelectronic assembly, in accordance with any of the embodiments disclosed herein.

FIG. 21 is a block diagram of an example electrical device 2100 that may include one or more of the integrated circuit components 100 disclosed herein. For example, any suitable ones of the components of the electrical device 2100 may include one or more of the integrated circuit device assemblies 2000, integrated circuit components 2020, integrated circuit devices 1800, or integrated circuit dies 1702 disclosed herein, and may be arranged in any of the integrated circuit components 100 disclosed herein. A number of components are illustrated in FIG. 21 as included in the electrical device 2100, but any one or more of these components may be omitted or duplicated, as suitable for the application. In some embodiments, some or all of the components included in the electrical device 2100 may be attached to one or more motherboards mainboards, or system boards. In some embodiments, one or more of these components are fabricated onto a single system-on-a-chip (SoC) die.

Additionally, in various embodiments, the electrical device 2100 may not include one or more of the components illustrated in FIG. 21, but the electrical device 2100 may include interface circuitry for coupling to the one or more components. For example, the electrical device 2100 may not include a display device 2106, but may include display device interface circuitry (e.g., a connector and driver circuitry) to which a display device 2106 may be coupled. In another set of examples, the electrical device 2100 may not include an audio input device 2124 or an audio output device 2108, but may include audio input or output device interface circuitry (e.g., connectors and supporting circuitry) to which an audio input device 2124 or audio output device 2108 may be coupled.

The electrical device 2100 may include one or more processor units 2102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 2102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 2100 may include a memory 2104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 2104 may include memory that is located on the same integrated circuit die as the processor unit 2102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 2100 can comprise one or more processor units 2102 that are heterogeneous or asymmetric to another processor unit 2102 in the electrical device 2100. There can be a variety of differences between the processing units 2102 in a system in terms of a spectrum of metrics of merit including architectural, micro-architectural, thermal, power consumption characteristics, and the like. These differences can effectively manifest themselves as asymmetry and heterogeneity among the processor units 2102 in the electrical device 2100.

In some embodiments, the electrical device 2100 may include a communication component 2112 (e.g., one or more communication components). For example, the communication component 2112 can manage wireless communications for the transfer of data to and from the electrical device 2100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 2112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 2112 may operate in accordance with other wireless protocols in other embodiments. The electrical device 2100 may include an antenna 2122 to facilitate wireless communications and/or to receive other wireless communications (such as AM or FM radio transmissions).

In some embodiments, the communication component 2112 may manage wired communications, such as electrical, optical, or any other suitable communication protocols (e.g., IEEE 802.3 Ethernet standards). As noted above, the communication component 2112 may include multiple communication components. For instance, a first communication component 2112 may be dedicated to shorter-range wireless communications such as Wi-Fi or Bluetooth, and a second communication component 2112 may be dedicated to longer-range wireless communications such as global positioning system (GPS), EDGE, GPRS, CDMA, WiMAX, LTE, EV-DO, or others. In some embodiments, a first communication component 2112 may be dedicated to wireless communications, and a second communication component 2112 may be dedicated to wired communications.

The electrical device 2100 may include battery/power circuitry 2114. The battery/power circuitry 2114 may include one or more energy storage devices (e.g., batteries or capacitors) and/or circuitry for coupling components of the electrical device 2100 to an energy source separate from the electrical device 2100 (e.g., AC line power).

The electrical device 2100 may include a display device 2106 (or corresponding interface circuitry, as discussed above). The display device 2106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 2100 may include an audio output device 2108 (or corresponding interface circuitry, as discussed above). The audio output device 2108 may include any embedded or wired or wirelessly connected external device that generates an audible indicator, such speakers, headsets, or earbuds.

The electrical device 2100 may include an audio input device 2124 (or corresponding interface circuitry, as discussed above). The audio input device 2124 may include any embedded or wired or wirelessly connected device that generates a signal representative of a sound, such as microphones, microphone arrays, or digital instruments (e.g., instruments having a musical instrument digital interface (MIDI) output). The electrical device 2100 may include a Global Navigation Satellite System (GNSS) device 2118 (or corresponding interface circuitry, as discussed above), such as a Global Positioning System (GPS) device. The GNSS device 2118 may be in communication with a satellite-based system and may determine a geolocation of the electrical device 2100 based on information received from one or more GNSS satellites, as known in the art.

The electrical device 2100 may include an other output device 2110 (or corresponding interface circuitry, as discussed above). Examples of the other output device 2110 may include an audio codec, a video codec, a printer, a wired or wireless transmitter for providing information to other devices, or an additional storage device.

The electrical device 2100 may include an other input device 2120 (or corresponding interface circuitry, as discussed above). Examples of the other input device 2120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 2100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 2100 may be any other electronic device that processes data. In some embodiments, the electrical device 2100 may comprise multiple discrete physical components. Given the range of devices that the electrical device 2100 can be manifested as in various embodiments, in some embodiments, the electrical device 2100 can be referred to as a computing device or a computing system.

EXAMPLES

Illustrative examples of the technologies disclosed herein are provided below. An embodiment of the technologies may include any one or more, and any combination of, the examples described below.

Example 1 includes an integrated circuit component comprising a glass layer, wherein a cavity is defined in the glass layer, wherein the cavity extends from a plane defined by a top surface of the glass layer to a plane defined by a bottom surface of the glass layer; a bridge die disposed in the cavity; one or more dies above the glass layer, wherein the one or more dies above the glass layer are bonded to the bridge die; and one or more dies below the glass layer, wherein the one or more dies below the glass layer are bonded to the bridge die.

Example 2 includes the subject matter of Example 1, and wherein one or more through glass vias are defined in the glass layer, further comprising one or more pillars comprising copper disposed in the one or more through glass vias, wherein the one or more dies above the glass layer are bonded to the one or more pillars, wherein the one or more dies below the glass layer are bonded to the one or more pillars.

Example 3 includes the subject matter of any of Examples 1 and 2, and wherein the one or more through glass vias comprise a plurality of through glass vias, wherein the plurality of through glass vias have a pitch less than 25 micrometers.

Example 4 includes the subject matter of any of Examples 1-3, and further including a second glass layer, wherein a second cavity is defined in the second glass layer, wherein the second cavity extends from a plane defined by a top surface of the second glass layer to a plane defined by a bottom surface of the second glass layer, wherein the one or more dies below the glass layer are disposed in the second cavity.

Example 5 includes the subject matter of any of Examples 1-4, and wherein the glass layer is bonded to the second glass layer with use of bond film.

Example 6 includes the subject matter of any of Examples 1-5, and wherein the glass layer is directly bonded to the second glass layer with use of glass fusion.

Example 7 includes the subject matter of any of Examples 1-6, and further including a third glass layer, wherein a third cavity is defined in the third glass layer, wherein the third cavity extends from a plane defined by a top surface of the third glass layer to a plane defined by a bottom surface of the third glass layer, wherein the one or more dies above the glass layer are disposed in the third cavity.

Example 8 includes the subject matter of any of Examples 1-7, and wherein the one or more dies above the glass layer are one or more photonic integrated circuit dies.

Example 9 includes the subject matter of any of Examples 1-8, and wherein one or more waveguides are defined in third glass layer, wherein one or more waveguides are defined in the one or more photonic integrated circuit dies, wherein the one or more waveguides defined in the one or more photonic integrated circuit dies are photonically coupled to the one or more waveguides defined in the third glass layer.

Example 10 includes the subject matter of any of Examples 1-9, and wherein one or more through silicon vias are defined in the bridge die, wherein the through silicon vias comprise copper, wherein the one or more dies above the glass layer are bonded to the one or more through silicon vias, wherein the one or more dies below the glass layer are bonded to the one or more through silicon vias.

Example 11 includes the subject matter of any of Examples 1-10, and wherein the one or more through silicon vias comprise a plurality of through silicon vias, wherein the plurality of through silicon vias have a pitch less than 25 micrometers.

Example 12 includes the subject matter of any of Examples 1-11, and wherein the one or more dies above the glass layer are one or more high-bandwidth memory dies.

Example 13 includes the subject matter of any of Examples 1-12, and wherein the one or more dies above the glass layer are thinner or thicker than the one or more dies below the glass layer by at least 10%.

Example 14 includes the subject matter of any of Examples 1-13, and wherein one or more through glass vias are defined in the glass layer, further comprising one or more pillars comprising copper disposed in the one or more through glass vias, wherein the one or more pillars are thermally coupled to a heat sink and to the one or more dies below the glass layer.

Example 15 includes the subject matter of any of Examples 1-14, and further including a first plurality of contact pads on the one or more dies above the glass layer; a second plurality of contact pads on the one or more dies above the glass layer; a plurality of contact pads on the bridge die; and a plurality of contact pads on the glass layer, wherein individual contact pads of the plurality of contact pads on the one or more dies above the glass layer are hybrid bonded with individual contact pads of the plurality of contact pads on the bridge die, wherein individual contact pads of the plurality of contact pads on the one or more dies above the glass layer are hybrid bonded with individual contact pads of the plurality of contact pads on the glass layer.

Example 16 includes the subject matter of any of Examples 1-15, and further including a bonded polyimide layer between the one or more dies above the glass layer.

Example 17 includes an integrated circuit component comprising a glass layer, wherein a cavity is defined in the glass layer, wherein the cavity extends from a plane defined by a top surface of the glass layer to a plane defined by a bottom surface of the glass layer; a bridge die disposed in the cavity; one or more dies above the glass layer; one or more dies below the glass layer; means for connecting the one or more dies above the glass layer to the bridge die; and means for connecting the one or more dies below the glass layer to the bridge die.

Example 18 includes the subject matter of Example 17, and wherein one or more through glass vias are defined in the glass layer, further comprising one or more pillars comprising copper disposed in the one or more through glass vias, wherein the one or more dies above the glass layer are bonded to the one or more pillars, wherein the one or more dies below the glass layer are bonded to the one or more pillars.

Example 19 includes the subject matter of any of Examples 17 and 18, and wherein the one or more through glass vias comprise a plurality of through glass vias, wherein the plurality of through glass vias have a pitch less than 25 micrometers.

Example 20 includes the subject matter of any of Examples 17-19, and further including a second glass layer, wherein a second cavity is defined in the second glass layer, wherein the second cavity extends from a plane defined by a top surface of the second glass layer to a plane defined by a bottom surface of the second glass layer, wherein the one or more dies below the glass layer are disposed in the second cavity.

Example 21 includes the subject matter of any of Examples 17-20, and wherein the glass layer is bonded to the second glass layer with use of bond film.

Example 22 includes the subject matter of any of Examples 17-21, and wherein the glass layer is directly bonded to the second glass layer with use of glass fusion.

Example 23 includes the subject matter of any of Examples 17-22, and further including a third glass layer, wherein a third cavity is defined in the third glass layer, wherein the third cavity extends from a plane defined by a top surface of the third glass layer to a plane defined by a bottom surface of the third glass layer, wherein the one or more dies above the glass layer are disposed in the third cavity.

Example 24 includes the subject matter of any of Examples 17-23, and wherein the one or more dies above the glass layer are one or more photonic integrated circuit dies.

Example 25 includes the subject matter of any of Examples 17-24, and wherein one or more waveguides are defined in third glass layer, wherein one or more waveguides are defined in the one or more photonic integrated circuit dies, wherein the one or more waveguides defined in the one or more photonic integrated circuit dies are photonically coupled to the one or more waveguides defined in the third glass layer.

Example 26 includes the subject matter of any of Examples 17-25, and wherein one or more through silicon vias are defined in the bridge die, wherein the through silicon vias comprise copper, wherein the means for connecting the one or more dies above the glass layer to the bridge die comprises one or more hybrid bonds between the one or more dies above the glass layer and the one or more through silicon vias, wherein the means for connecting the one or more dies below the glass layer to the bridge die comprises one or more hybrid bonds between the one or more dies below the glass layer and the one or more through silicon vias.

Example 27 includes the subject matter of any of Examples 17-26, and wherein the one or more through silicon vias comprise a plurality of through silicon vias, wherein the plurality of through silicon vias have a pitch less than 25 micrometers.

Example 28 includes the subject matter of any of Examples 17-27, and wherein the one or more dies above the glass layer are one or more high-bandwidth memory dies.

Example 29 includes the subject matter of any of Examples 17-28, and wherein the one or more dies above the glass layer are thinner or thicker than the one or more dies below the glass layer by at least 10%.

Example 30 includes the subject matter of any of Examples 17-29, and wherein one or more through glass vias are defined in the glass layer, further comprising one or more pillars comprising copper disposed in the one or more through glass vias, wherein the one or more pillars are thermally coupled to a heat sink and to the one or more dies below the glass layer.

Example 31 includes the subject matter of any of Examples 17-30, and further including a first plurality of contact pads on the one or more dies above the glass layer; a second plurality of contact pads on the one or more dies above the glass layer; a plurality of contact pads on the bridge die; and a plurality of contact pads on the glass layer, wherein the means for connecting the one or more dies above the glass layer to the bridge die comprises one or more hybrid bonds between individual contact pads of the plurality of contact pads on the one or more dies above the glass layer and individual contact pads of the plurality of contact pads on the bridge die, wherein individual contact pads of the plurality of contact pads on the one or more dies above the glass layer are hybrid bonded with individual contact pads of the plurality of contact pads on the glass layer.

Example 32 includes the subject matter of any of Examples 17-31, and further including a bonded polyimide layer between the one or more dies above the glass layer.

Example 33 includes a method comprising patterning a cavity in a glass layer, wherein the cavity extends from a plane defined by a top surface of the glass layer to a plane defined by a bottom surface of the glass layer; positioning a bridge die in the cavity; attaching one or more dies above the glass layer to the bridge die; and attaching one or more dies below the glass layer to the bridge die.

Example 34 includes the subject matter of Example 33, and further including patterning a second cavity in a second glass layer, wherein the second cavity extends from a plane defined by a top surface of the second glass layer to a plane defined by a bottom surface of the second glass layer; positioning the one or more dies above the glass layer in the second cavity; patterning a third cavity in a third glass layer, wherein the third cavity extends from a plane defined by a top surface of the third glass layer to a plane defined by a bottom surface of the third glass layer; and positioning the one or more dies below the glass layer in the third cavity.

Example 35 includes the subject matter of any of Examples 33 and 34, and wherein the glass layer is bonded to the second glass layer with use of bond film.

Example 36 includes the subject matter of any of Examples 33-35, and wherein the glass layer is directly bonded to the second glass layer with use of glass fusion.

Example 37 includes the subject matter of any of Examples 33-36, and further including forming one or more through glass vias in the glass layer with use of direct laser writing; and depositing copper in the one or more through glass vias.

Example 38 includes the subject matter of any of Examples 33-37, and wherein one or more through glass vias are defined in the glass layer, further comprising one or more pillars comprising copper disposed in the one or more through glass vias, wherein the one or more dies above the glass layer are bonded to the one or more pillars, wherein the one or more dies below the glass layer are bonded to the one or more pillars.

Example 39 includes the subject matter of any of Examples 33-38, and wherein the one or more through glass vias comprise a plurality of through glass vias, wherein the plurality of through glass vias have a pitch less than 25 micrometers.

Example 40 includes the subject matter of any of Examples 33-39, and wherein one or more through silicon vias are defined in the bridge die, wherein the through silicon vias comprise copper, wherein the one or more dies above the glass layer are bonded to the one or more through silicon vias, wherein the one or more dies below the glass layer are bonded to the one or more through silicon vias.

Example 41 includes the subject matter of any of Examples 33-40, and wherein the one or more through silicon vias comprise a plurality of through silicon vias, wherein the plurality of through silicon vias have a pitch less than 25 micrometers.

Example 42 includes the subject matter of any of Examples 33-41, and wherein the one or more dies above the glass layer are one or more high-bandwidth memory dies.

Example 43 includes the subject matter of any of Examples 33-42, and wherein the one or more dies above the glass layer are thinner or thicker than the one or more dies below the glass layer by at least 10%.

Example 44 includes the subject matter of any of Examples 33-43, and wherein one or more through glass vias are defined in the glass layer, wherein one or more pillars comprising copper are disposed in the one or more through glass vias, wherein the one or more pillars are thermally coupled to a heat sink and to the one or more dies below the glass layer.

Example 45 includes the subject matter of any of Examples 33-44, and wherein a first plurality of contact pads are on the one or more dies above the glass layer; a second plurality of contact pads are on the one or more dies above the glass layer; a plurality of contact pads are on the bridge die; and a plurality of contact pads are on the glass layer, wherein individual contact pads of the plurality of contact pads on the one or more dies above the glass layer are hybrid bonded with individual contact pads of the plurality of contact pads on the bridge die, wherein individual contact pads of the plurality of contact pads on the one or more dies above the glass layer are hybrid bonded with individual contact pads of the plurality of contact pads on the glass layer.

Example 46 includes the subject matter of any of Examples 33-45, and wherein a bonded polyimide layer is between the one or more dies above the glass layer.

The invention claimed is:

1. An integrated circuit component comprising:
   a glass layer, wherein a cavity is defined in the glass layer, wherein the cavity extends from a plane defined by a top surface of the glass layer to a plane defined by a bottom surface of the glass layer;
   a bridge die disposed in the cavity;
   one or more dies above the glass layer, wherein the one or more dies above the glass layer are bonded to the bridge die; and
   one or more dies below the glass layer, wherein the one or more dies below the glass layer are bonded to the bridge die.

2. The integrated circuit component of claim 1, wherein one or more through glass vias are defined in the glass layer, further comprising one or more pillars comprising copper disposed in the one or more through glass vias,
   wherein the one or more dies above the glass layer are bonded to the one or more pillars, wherein the one or more dies below the glass layer are bonded to the one or more pillars.

3. The integrated circuit component of claim 2, wherein the one or more through glass vias comprise a plurality of through glass vias, wherein the plurality of through glass vias have a pitch less than 25 micrometers.

4. The integrated circuit component of claim 1, further comprising a second glass layer, wherein a second cavity is defined in the second glass layer, wherein the second cavity extends from a plane defined by a top surface of the second glass layer to a plane defined by a bottom surface of the second glass layer, wherein the one or more dies below the glass layer are disposed in the second cavity.

5. The integrated circuit component of claim 4, wherein the glass layer is bonded to the second glass layer with use of bond film.

6. The integrated circuit component of claim 4, wherein the glass layer is directly bonded to the second glass layer with use of glass fusion.

7. The integrated circuit component of claim 4, further comprising a third glass layer, wherein a third cavity is defined in the third glass layer, wherein the third cavity extends from a plane defined by a top surface of the third glass layer to a plane defined by a bottom surface of the third glass layer, wherein the one or more dies above the glass layer are disposed in the third cavity.

8. The integrated circuit component of claim 7, wherein the one or more dies above the glass layer are one or more photonic integrated circuit dies.

9. The integrated circuit component of claim 8, wherein one or more waveguides are defined in third glass layer, wherein one or more waveguides are defined in the one or more photonic integrated circuit dies, wherein the one or more waveguides defined in the one or more photonic integrated circuit dies are photonically coupled to the one or more waveguides defined in the third glass layer.

10. The integrated circuit component of claim 1, wherein one or more through silicon vias are defined in the bridge die, wherein the one or more through silicon vias comprise copper, wherein the one or more dies above the glass layer are bonded to the one or more through silicon vias, wherein the one or more dies below the glass layer are bonded to the one or more through silicon vias.

11. The integrated circuit component of claim 10, wherein the one or more through silicon vias comprise a plurality of through silicon vias, wherein the plurality of through silicon vias have a pitch less than 25 micrometers.

12. The integrated circuit component of claim 1, wherein the one or more dies above the glass layer are one or more high-bandwidth memory dies.

13. The integrated circuit component of claim 1, wherein the one or more dies above the glass layer are thinner or thicker than the one or more dies below the glass layer by at least 10%.

14. The integrated circuit component of claim 1, wherein one or more through glass vias are defined in the glass layer, further comprising one or more pillars comprising copper disposed in the one or more through glass vias, wherein the one or more pillars are thermally coupled to a heat sink and to the one or more dies below the glass layer.

15. The integrated circuit component of claim 1, further comprising:

a first plurality of contact pads on the one or more dies above the glass layer;

a second plurality of contact pads on the one or more dies above the glass layer;

a plurality of contact pads on the bridge die; and a plurality of contact pads on the glass layer, wherein individual contact pads of the plurality of contact pads on the one or more dies above the glass layer are hybrid bonded with individual contact pads of the plurality of contact pads on the bridge die, wherein individual contact pads of the plurality of contact pads on the one or more dies above the glass layer are hybrid bonded with individual contact pads of the plurality of contact pads on the glass layer.

16. An integrated circuit component comprising:

a glass layer, wherein a cavity is defined in the glass layer, wherein the cavity extends from a plane defined by a top surface of the glass layer to a plane defined by a bottom surface of the glass layer;

a bridge die disposed in the cavity;

one or more dies above the glass layer;

one or more dies below the glass layer;

means for connecting the one or more dies above the glass layer to the bridge die; and means for connecting the one or more dies below the glass layer to the bridge die.

17. The integrated circuit component of claim 16, wherein one or more through silicon vias are defined in the bridge die, wherein the one or more through silicon vias comprise copper, wherein the means for connecting the one or more dies above the glass layer to the bridge die comprises one or more hybrid bonds between the one or more dies above the glass layer and the one or more through silicon vias, wherein the means for connecting the one or more dies below the glass layer to the bridge die comprises one or more hybrid bonds between the one or more dies below the glass layer and the one or more through silicon vias.

18. A method comprising:

patterning a cavity in a glass layer, wherein the cavity extends from a plane defined by a top surface of the glass layer to a plane defined by a bottom surface of the glass layer;

positioning a bridge die in the cavity;

attaching one or more dies above the glass layer to the bridge die; and attaching one or more dies below the glass layer to the bridge die.

19. The method of claim 18, further comprising:

patterning a second cavity in a second glass layer, wherein the second cavity extends from a plane defined by a top surface of the second glass layer to a plane defined by a bottom surface of the second glass layer;

positioning the one or more dies above the glass layer in the second cavity;

patterning a third cavity in a third glass layer, wherein the third cavity extends from a plane defined by a top surface of the third glass layer to a plane defined by a bottom surface of the third glass layer; and positioning the one or more dies below the glass layer in the third cavity.

20. The method of claim 19, wherein the glass layer is directly bonded to the second glass layer with use of glass fusion.

* * * * *